US011670725B2

(12) United States Patent
Liu

(10) Patent No.: US 11,670,725 B2
(45) Date of Patent: Jun. 6, 2023

(54) IMAGE SENSOR WITH ABSORPTION ENHANCEMENT STRUCTURE

(71) Applicant: Taiwan Semiconductor Manufacturing Co., Ltd., Hsin-Chu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 240 days.

(21) Appl. No.: 16/996,130

(22) Filed: Aug. 18, 2020

(65) Prior Publication Data

US 2021/0265514 A1     Aug. 26, 2021

Related U.S. Application Data

(60) Provisional application No. 62/981,124, filed on Feb. 25, 2020.

(51) Int. Cl.
*H01L 31/02* (2006.01)
*H01L 31/0236* (2006.01)
*G01J 1/42* (2006.01)
*H01L 27/146* (2006.01)
*H01L 31/0216* (2014.01)
*G01J 1/04* (2006.01)

(52) U.S. Cl.
CPC ...... *H01L 31/02363* (2013.01); *G01J 1/0411* (2013.01); *G01J 1/42* (2013.01); *H01L 27/1464* (2013.01); *H01L 31/02161* (2013.01)

(58) Field of Classification Search
None
See application file for complete search history.

(56) References Cited

U.S. PATENT DOCUMENTS

| 6,127,623 | A  | * | 10/2000 | Nakamura | H01L 31/068 257/E31.13 |
| 6,313,397 | B1 | * | 11/2001 | Washio | H01L 31/0236 429/111 |
| 10,163,974 | B2 |  | 12/2018 | Su et al. | |
| 2010/0018576 | A1 | * | 1/2010 | Kim | H01L 31/02363 136/256 |
| 2013/0003204 | A1 | * | 1/2013 | Cheng | H01L 31/02366 359/850 |

(Continued)

OTHER PUBLICATIONS

Schneider et al. "Pyramidal Surface Textures for Light Trapping and Antireflection in Perovskite-on-Silicon Tandem Solar Cells." Optics Express, vol. 22, No. S6, published Oct. 20, 2014.

(Continued)

*Primary Examiner* — Benjamin P Sandvik
(74) *Attorney, Agent, or Firm* — Eschweiler & Potashnik, LLC

(57) ABSTRACT

The present disclosure relates to an image sensor. The image sensor includes a substrate and a photodetector in the substrate. The image sensor further includes an absorption enhancement structure. The absorption enhancement structure is defined by a substrate depression along a first side of the substrate. The substrate depression is defined by a first plurality of sidewalls that slope toward a first common point and by a second plurality of sidewalls that slope toward a second common point. The first plurality of sidewalls extend over the second plurality of sidewalls.

20 Claims, 28 Drawing Sheets

(56) References Cited

U.S. PATENT DOCUMENTS

| | | | |
|---|---|---|---|
| 2014/0242801 A1* | 8/2014 | Desplats | H01L 21/76232 |
| | | | 438/710 |
| 2015/0287761 A1 | 10/2015 | Huang et al. | |
| 2018/0337211 A1* | 11/2018 | Su | H01L 27/14685 |
| 2018/0359434 A1 | 12/2018 | Tanaka et al. | |
| 2019/0067346 A1 | 2/2019 | Borthakur | |
| 2019/0148422 A1 | 5/2019 | Cheng et al. | |
| 2019/0165026 A1 | 5/2019 | Kuo et al. | |

OTHER PUBLICATIONS

Honsberg et al. "Surface Texturing." The date of publication is unknown. Retrieved online on Aug. 18, 2020 from https://www.pveducation.org/pvcdrom/design-of-silicon-cells/surface-texturing.
U.S. Appl. No. 16/848,903, filed Apr. 15, 2020.

* cited by examiner

IMAGE SENSOR WITH ABSORPTION ENHANCEMENT STRUCTURE

REFERENCE TO RELATED APPLICATION

This application claims the benefit of U.S. Provisional Application No. 62/981,124, filed on Feb. 25, 2020, the contents of which are hereby incorporated by reference in their entirety.

BACKGROUND

Integrated circuits (ICs) with image sensors are used in a wide range of modern day electronic devices, such as, for example, cameras and cell phones. In recent years, complementary metal-oxide-semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
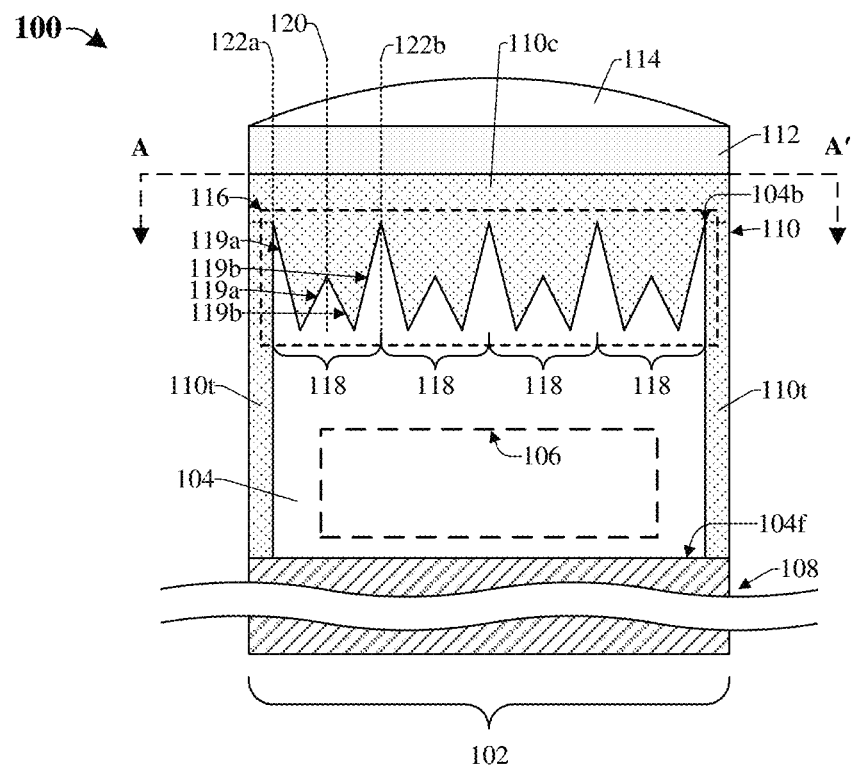
FIG. 1 illustrates a cross-sectional view of some embodiments of an image sensor comprising an absorption enhancement structure that is defined by one or more substrate depressions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many image sensors include a plurality of pixels along a substrate. For example, a pixel includes a photodetector in the substrate. In a back-side illuminated (BSI) image sensor, an interconnect structure extends along a front-side of the substrate and is electrically connected to the photodetector. The pixel is separated from neighboring pixels by a dielectric structure that surrounds the photodetector along a boundary of the pixel. The dielectric structure is configured to provide for electrical isolation between the neighboring pixels. The dielectric structure may further extend over a back-side of the substrate opposite the front-side. In addition, a color filter and a lens extend over the back side of the substrate. Photons may enter the pixel through the lens and may impinge on the back-side of the substrate. Photons that are absorbed by the substrate may be converted into electrical current by the photodetector.

Some photons, however, may not be absorbed by the substrate and may instead be reflected away from the substrate. The photodetector is not able to detect these reflected photons. As a result, a performance of the image sensor (e.g., a quantum efficiency (QE)) may be low. These photons may be reflected due to the angle at which they impinge on the back-side of the substrate (e.g., the angle of incidence of the photon) and due to the index of refraction of the substrate.

Various embodiments of the present disclosure are related to an image sensor comprising an absorption enhancement structure for improving a performance of the image sensor. The image sensor comprises a photodetector in a substrate. The absorption enhancement structure extends over the photodetector along a back-side of the substrate. The absorption enhancement structure is defined by one or more substrate depressions. A substrate depression of the one or more substrate depressions is defined by a first plurality of sidewalls of the substrate that slope toward a first common point and by a second plurality of sidewalls of the substrate that slope toward a second common point. Photons may impinge on the absorption enhancement structure along the back-side of the substrate and may be converted into electrical current by the photodetector.

By including the absorption enhancement structure in the image sensor, the photons that may impinge on the absorption enhancement structure may have a greater likelihood of being absorbed by the substrate due to the shape of the one or more substrate depressions.

For example, some photons that impinge on the absorption enhancement structure may have a lesser angle of incidence due to the shapes of the one or more substrate depressions. Thus, the photons may experience increased refraction and decreased reflection. Further, some photons that experience reflection may be reflected back toward another surface of the absorption enhancement structure due to the shape of the one or more substrate depressions. In turn, those photons that experienced reflection when first impinging on the absorption enhancement structure may not experience reflection upon impinging on the substrate the second time. In short, the absorption enhancement structure may reduce an overall reflectance of the substrate and, in turn, may increase an overall absorption of the substrate. As a result, a performance (e.g., a QE) of the image sensor may be improved.

FIG. 1 illustrates a cross-sectional view 100 of some embodiments of an image sensor comprising an absorption enhancement structure 116 that is defined by one or more substrate depressions 118. The cross-sectional view 100 of FIG. 1 may, for example, be taken across line A-A' of FIG. 3.

In such embodiments, the image sensor comprises a pixel 102 along a substrate 104. The pixel 102 comprises a photodetector 106 in the substrate 104. The pixel 102 further comprises a dielectric structure 110 over the photodetector 106 and surrounding the photodetector 106. The dielectric structure 110 comprises a trench region 110t and a cap region 110c. The trench region 110t surrounds the photodetector 106 along a boundary of the pixel 102 and isolates the pixel 102 from neighboring pixels. The cap region 110c extends over the photodetector 106 along a back-side 104b of the substrate 104. In some embodiments, a color filter 112 is over the dielectric structure 110 and a lens 114 is over the color filter 112. Photons (not shown) may enter the pixel 102 through the lens 114 and the color filter 112.

In some embodiments, an interconnect structure 108 extends along a front-side 104f of the substrate 104. The interconnect structure 108 may comprise a plurality of interconnects disposed within a stack of inter-level dielectric (ILD) layers. In some embodiments, the plurality of interconnects may comprise any of a contact, a metal wire, a metal via, a solder bump, a bond pad, or the like. In addition, the interconnect structure 108 may be electrically connected to the photodetector 106.

An absorption enhancement structure 116 is on the back-side 104b of the substrate 104. The absorption enhancement structure 116 extends over the photodetector 106 along an interface between the substrate 104 and the cap region 110c of the dielectric structure 110. The absorption enhancement structure 116 is defined by one or more substrate depressions 118. In some embodiments, the dielectric structure 110 extends along the one or more substrate depressions 118 of the absorption enhancement structure 116 such that the dielectric structure 110 is interdigitated with the one or more substrate depressions 118. Although the absorption enhancement structure 116 is described as being defined by one or more substrate depressions 118, it will be appreciated that the absorption enhancement structure 116 may alternatively be described as being defined by one or more substrate protrusions.

The one or more substrate depressions 118 are respectively defined by multiple surfaces (e.g., 119a, 119b) arranged along opposing sides of a depression as viewed in a cross-sectional view. For example, the one or more substrate depressions 118 may respectively have a first plurality of surfaces 119a laterally between a vertical line 120 bisecting the depression and a first outermost edge of the depression 122a. Further, the one or more substrate depressions 118 may respectively have a second plurality of surfaces 119b laterally between the vertical line 120 and a second outermost edge of the depression 122b.

Having multiple surfaces along each side of a depression increases reflection of radiation within the depression. By increasing reflection of radiation within the depression, radiation that is reflected away from the substrate 104 is more likely to restrike the substrate 104 at an angle of incidence that allows for the light to be absorbed by the substrate 104, thereby increasing an absorption of radiation by the substrate 104 and improving a performance of the image sensor.

Figure 2:
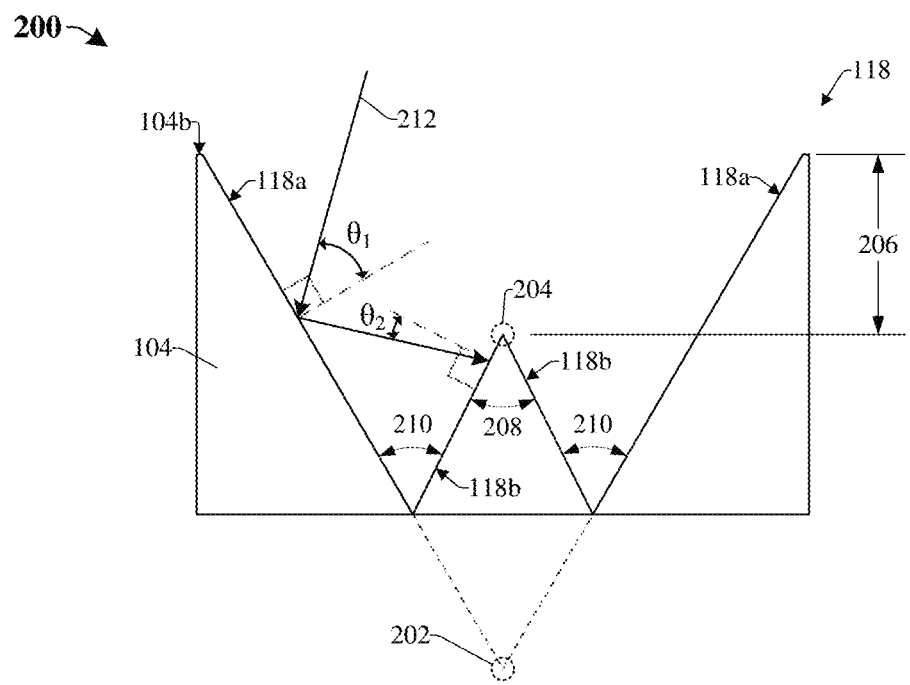
FIG. 2 illustrates a cross-sectional view of some embodiments of a substrate depression.

FIG. 2 illustrates a cross-sectional view 200 of some embodiments of a substrate depression 118.

In such embodiments, a substrate depression 118 is defined by a first plurality of sidewalls 118a of the substrate 104 that slope downward toward a first common point 202 and by a second plurality of sidewalls 118b of the substrate 104 that slope upward from the first plurality of sidewalls 118a toward a second common point 204. The second common point 204 is over the first common point 202. Further, the first plurality of sidewalls 118a extend over the second plurality of sidewalls 118b. In some embodiments, the second plurality of sidewalls 118b may meet at the second common point 204. In some embodiments, a distance 206 between the second common point 204 (i.e., a vertex of a first non-zero angle 208) and a top surface of the substrate 104 may, for example, be about 10 angstroms to 1 micrometer or some other suitable value.

In other words, the substrate depression 118 is defined by a first pair of sidewalls 118a of the substrate 104 and a second pair of sidewalls 118b of the substrate 104 that extend between the first pair of sidewalls 118a. In some embodiments, the second pair of sidewalls are separated by and/or meet at a first non-zero angle 208. Further, the first pair of sidewalls 118a and the second pair of sidewalls 118b are separated by and/or meet at a pair of second non-zero angles 210. In some embodiments, the first non-zero angle 208 may be between approximately 50° and approximately 90°, between approximately 60° and approximately 80°, or some other suitable values. In some embodiments, the second non-zero angle 210 may be between approximately 50° and approximately 90°, between approximately 60° and approximately 80°, or some other suitable values.

By including the one or more substrate depressions 118 in the image sensor, a performance of the image sensor may be improved. This is because photons that enter the pixel 102 and that impinge on the one or more substrate depressions 118 may experience increased refraction due to the shape (e.g., the angles of the sidewalls 118a, 118b and/or the positions of the sidewalls 118a, 118b) of the one or more substrate depressions 118 that define the absorption enhancement structure 116. In some cases, a photon that impinges on the absorption enhancement structure 116 and that is reflected may have a greater likelihood of impinging on the substrate 104 for a second time due to the shape of the one or more substrate depressions 118. For example, a photon that impinges on, and is reflected by, one of the first plurality of sidewalls 118a may have a high probability of being reflected toward and impinging on one of the second plurality of sidewalls 118b.

For example, photons 212 striking a first sidewall 118a at a first angle $\theta_1$ that is greater than a critical angle (not shown) may reflect off of the first sidewall 118a and strike a second sidewall 118b at a second angle $\theta_2$ that is less than the critical angle (not shown). Because the second angle $\theta_2$ is less than the critical angle, at least some of the photons 212 will be absorbed by the substrate 104. Furthermore, because the photons 212 have been reflected off of angled sidewalls of the substrate 104, the photons 212 may enter the substrate 104 along angles that increase a path length of the photons in the substrate 104. By increasing a path length of the photons 212 in the substrate 104, absorption of the photons 212 by the substrate 104 is further increased.

Thus, the photons may have a greater likelihood of being absorbed by the substrate 104 due to the increased contact with the substrate 104. As a result, a reflectance of the substrate 104 may be reduced and a performance (e.g., a QE or some other performance metric) of the image sensor may be improved. For example, a reflectance of a flat substrate without the absorption enhancement structure 116 may be in a range from about 50% to 35% for photons having a wavelength of about 400 to 1100 nanometers, a reflectance of a substrate having one or more single pyramidal structures may be in a range from about 20% to 12% for photons having a wavelength of about 400 to 1100 nanometers, and the reflectance of the pixel 102 having the absorption enhancement structure 116 may be in a range from about 11% to 5% for photons having a wavelength of about 400 to 1100 nanometers. Further, the QE of the present disclosure may be especially improved for near-infrared (NIR) radiation (e.g., radiation having a wavelength of more than 800 nanometers). For example, the QE of the photodetector 106 with the absorption enhancement structure 116 may be about 40% for photons having a wavelength of about 940 nanometers, and may be about 60% for photons having a wavelength of about 850 nanometers.

Figure 3:
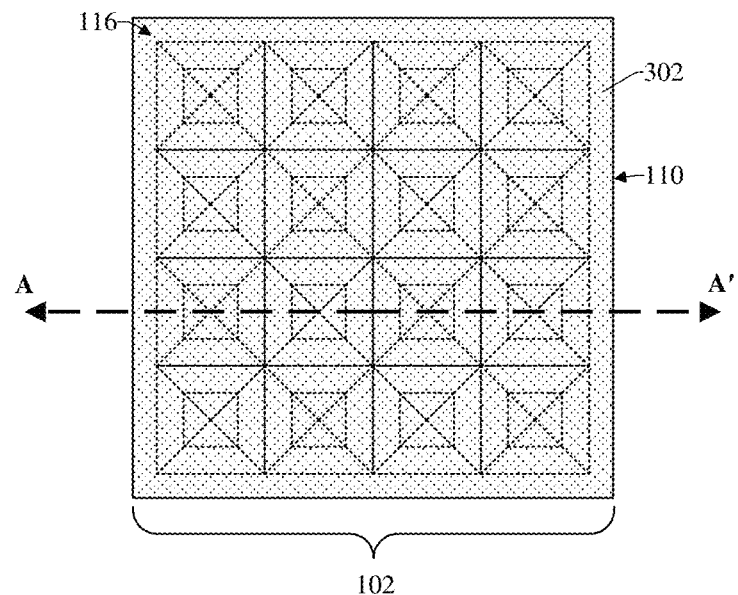
FIG. 3 illustrates a top view of some embodiments of an image sensor comprising an absorption enhancement structure.

FIG. 3 illustrates a top view 300 of some embodiments of an image sensor comprising an absorption enhancement structure 116.

In such embodiments, the absorption enhancement structure 116 comprises an array of substrate depressions 118 disposed over a pixel 102. For example, the absorption enhancement structure 116 may comprise a four-by-four array of substrate depressions 118 arranged over a pixel 102, as illustrated in FIG. 3. However, it will be appreciated that arrays having other dimensions (e.g., one-by-one, two-by-two, two-by-three, ten-by-ten, or the like) are also feasible. In some embodiments, the array of substrate depressions 118 may be surrounded by a substantially flat surface 302 extending around a perimeter of the pixel 102. The substantially flat surface 302 may separate the array of substrate depressions 118 from additional arrays of substrate depressions 118 disposed over neighboring pixels.

Figure 4:
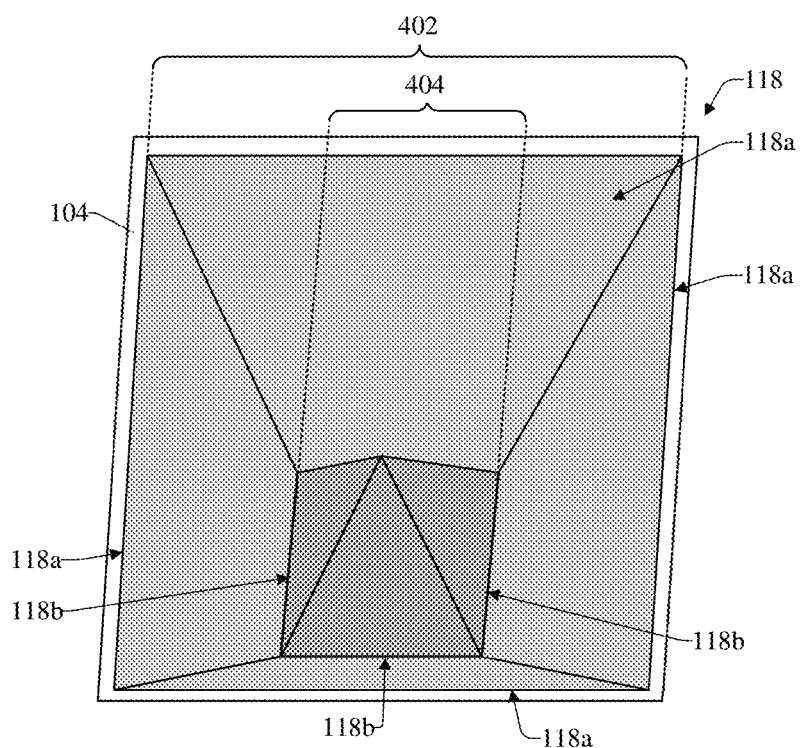
FIG. 4 illustrates a three-dimensional view of some embodiments of a substrate depression.

FIG. 4 illustrates a three-dimensional view 400 of some embodiments of a substrate depression 118.

In such embodiments, the substrate depression 118 is defined by an inverted pyramid-like depression 402 with a pyramid-like protrusion 404 positioned in the center of the inverted pyramid-like depression 402. The inverted pyramid-like depression 402 is defined by first sidewalls 118a of a substrate 104. In some embodiments, the first sidewalls 118a of the substrate 104 may have an outer boarder that is a substantially square shape. The pyramid-like protrusion 404 is defined by second sidewalls 118b of a substrate 104. In some embodiments, the second sidewalls 118b of the substrate 104 may have an outer boarder that is a substantially square shape.

Although FIG. 4 illustrates differently shaded regions, each region of FIG. 4 is a portion of the substrate 104, and the shading is used only to more clearly illustrate the shape of the substrate depression 118. Further, although the inverted pyramid-like depression and the pyramid-like protrusion are shown with four-sided (e.g., square) bases, it will be appreciated that pyramid-like depressions and/or protrusions with differently shaped bases are also feasible. For example, pyramid-like depressions and/or protrusions with three-sided basses are also feasible. Further, although pyramid-like depressions and protrusions are shown, it will be appreciated that differently shaped depressions and/or protrusions are also feasible. For example, cone-like depressions and/or protrusions are also feasible.

Figure 5:
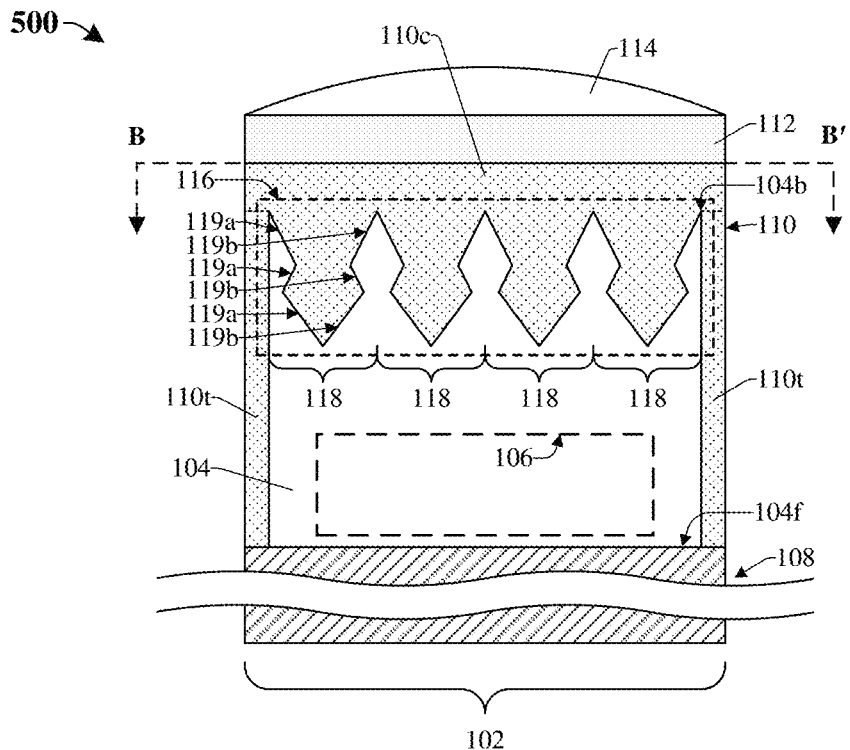
FIG. 5 illustrates a cross-sectional view of some other embodiments of an image sensor comprising an absorption enhancement structure that is defined by one or more substrate depressions.

FIG. 5 illustrates a cross-sectional view 500 of some other embodiments of an image sensor comprising an absorption enhancement structure 116 that is defined by one or more substrate depressions 118. The cross-sectional view 500 of FIG. 5 may, for example, be taken across line B-B' of FIG. 7.

In such embodiments, an absorption enhancement structure 116 is on the back-side 104b of the substrate 104 and is defined by one or more substrate depressions 118. The one or more substrate depressions 118 illustrated in FIG. 5 are shaped differently than those illustrated in FIG. 1. In some embodiments, the one or more substrate depressions 118 may be respectively defined by multiple surfaces (e.g., 119a, 119b) arranged along opposing sides of a depression as viewed in a cross-sectional view.

Again, by including the absorption enhancement structure 116 in the image sensor, a performance (e.g., a QE or the like) of the image sensor may be improved.

Figure 6:
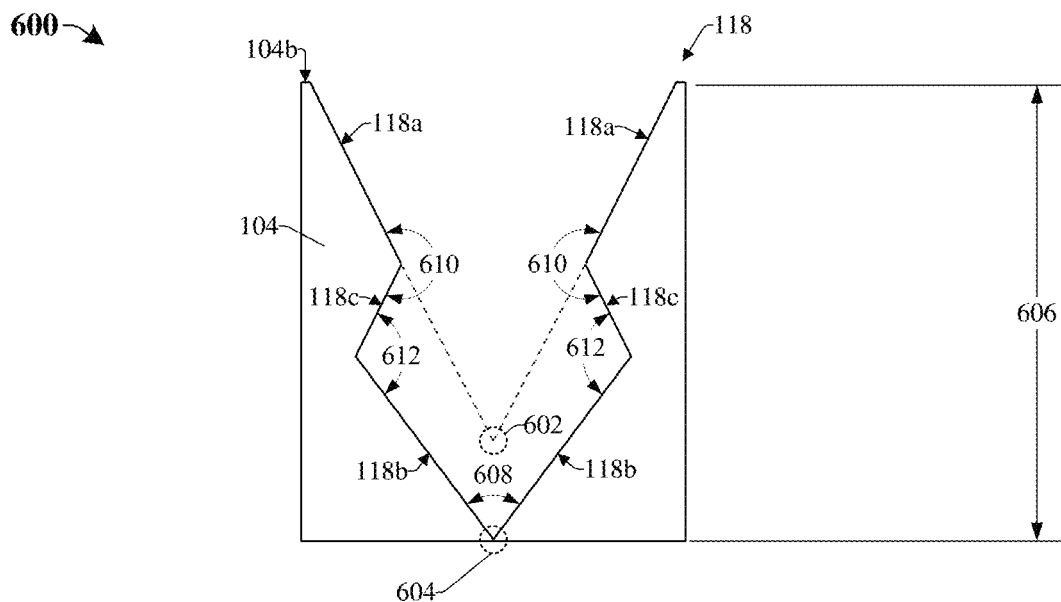
FIG. 6 illustrates a cross-sectional view of some other embodiments of a substrate depression.

FIG. 6 illustrates a cross-sectional view 600 of some other embodiments of a substrate depression 118.

In such embodiments, a substrate depression 118 of the one or more substrate depressions 118 is defined by a first plurality of sidewalls 118a of a substrate 104 that slope downward toward a first common point 602, a second plurality of sidewalls 118b of the substrate 104 that slope downward toward a second common point 604. The first common point 602 is over the second common point 604. Further, the first plurality of sidewalls 118a are over the second plurality of sidewalls 118b. In some embodiments, the second plurality of sidewalls 118b may meet at the second common point 604. In some embodiments, a distance 606 between the second common point 604 (i.e., a vertex of a first non-zero angle 608) and a top surface of the substrate 104 may, for example, be about 10 angstroms to 1 micrometer or some other suitable value.

In other words, a substrate depression 118 is defined by a first pair of sidewalls 118a of the substrate 104, a second pair of sidewalls 118b of the substrate 104, and a third pair of sidewalls 118c of the substrate 104. The second pair of sidewalls 118b extend between the first pair of sidewalls 118a. The first pair of sidewalls 118a are over the second pair of sidewalls 118b. In addition, the second pair of sidewalls 118b are separated by and/or meet at a first non-zero angle 608. Further, the first pair of sidewalls 118a and the third pair of sidewalls 118c are separated by and/or meet at a pair of second non-zero angles 610. Furthermore, the second pair of sidewalls 118b and the third pair of sidewalls 118c are separated by and/or meet at a pair of third non-zero angles 612.

In some embodiments, the first non-zero angle 608 may be between approximately 50° and approximately 90°, between approximately 60° and approximately 80°, or some other suitable values. In some embodiments, the second non-zero angle 610 may be between approximately 190° and approximately 260°, between approximately 210° and approximately 240°, or some other suitable values. In some embodiments, the third non-zero angle 612 may be between approximately 50° and approximately 120°, between approximately 70° and approximately 100°, or some other suitable values.

Figure 7:
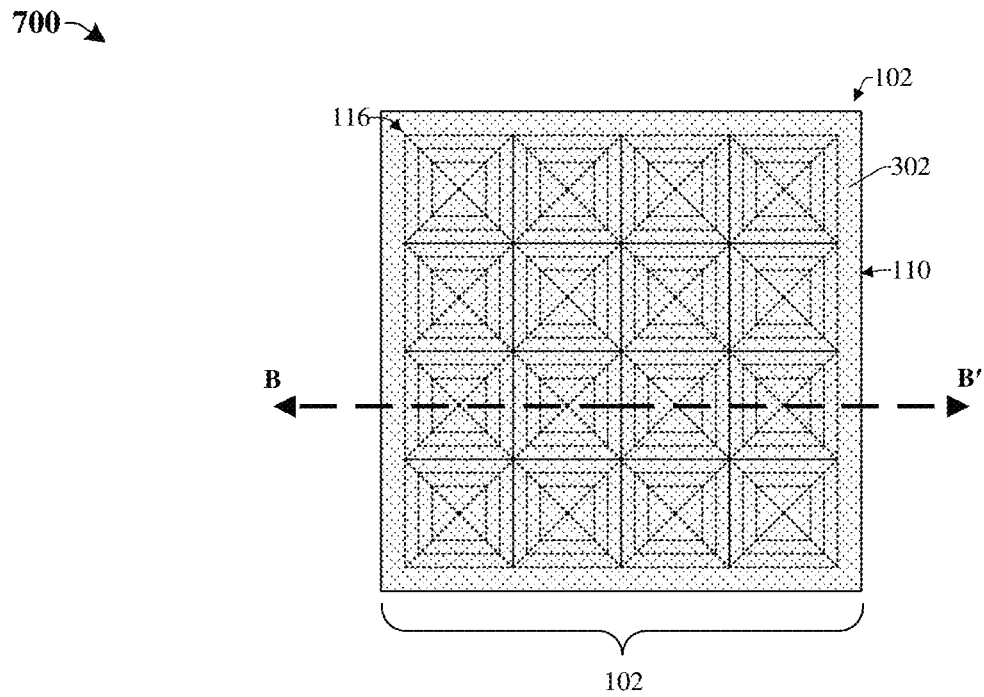
FIG. 7 illustrates a top view of some other embodiments of an image sensor comprising an absorption enhancement structure.

FIG. 7 illustrates a top view 700 of some other embodiments of an image sensor comprising an absorption enhancement structure 116.

In such embodiments, the absorption enhancement structure 116 comprises an array of substrate depressions 118 over a pixel 102. For example, the absorption enhancement structure 116 may comprise a four-by-four array of substrate depressions 118, as illustrated in FIG. 7. However, other dimension arrays are also feasible. The dimension of the array may affect, or may be affected by, a pitch of the image sensor. Thus, in some embodiments where a smaller pitch is desired, a smaller dimension array of substrate depressions 118 may be implemented.

Figure 8:
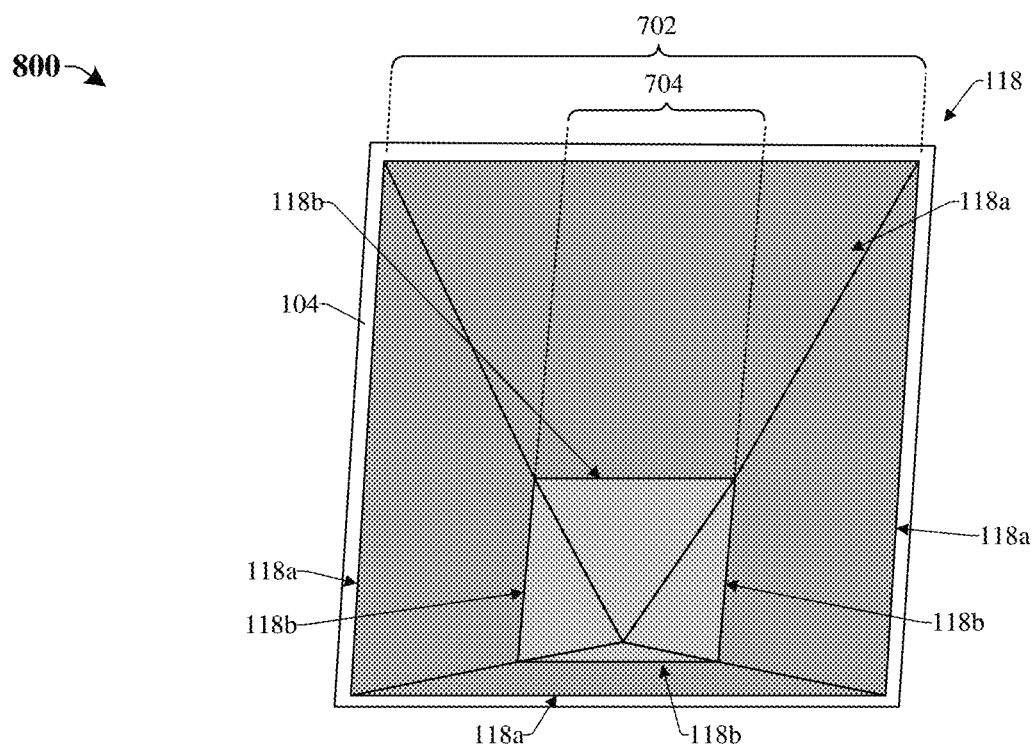
FIG. 8 illustrates a three-dimensional view of some other embodiments of a substrate depression.

FIG. 8 illustrates a three-dimensional view 800 of some other embodiments of a substrate depression 118.

In such embodiments, a substrate depression 118 is defined by a first inverted pyramid-like depression 702 and a second inverted pyramid-like depression 704 positioned directly below the first inverted pyramid-like depression 702. The first inverted pyramid-like depression 702 is defined by first sidewalls 118a of a substrate 104. In some embodiments, the first sidewalls 118a of the substrate 104 may have an outer boarder that is a substantially square shape. The second inverted pyramid-like depression 704 is defined by second sidewalls 118b of a substrate 104. In some embodiments, the second sidewalls 118b of the substrate 104 may have an outer boarder that is a substantially square shape.

Although FIG. 8 illustrates differently shaded regions, each region of FIG. 8 is a portion of the substrate 104, and the shading is used only to more clearly illustrate the shape of the substrate depression 118. Further, although the first and second inverted pyramid-like depressions are shown with four-sided (e.g., square) bases, it will be appreciated that pyramid-like depressions with differently shaped bases are also feasible. For example, pyramid-like depressions with three-sided bases are also feasible. Further, although pyramid-like depressions are shown, it will be appreciated that differently shaped depressions are also feasible. For example, cone-like depressions are also feasible.

Figure 9A:
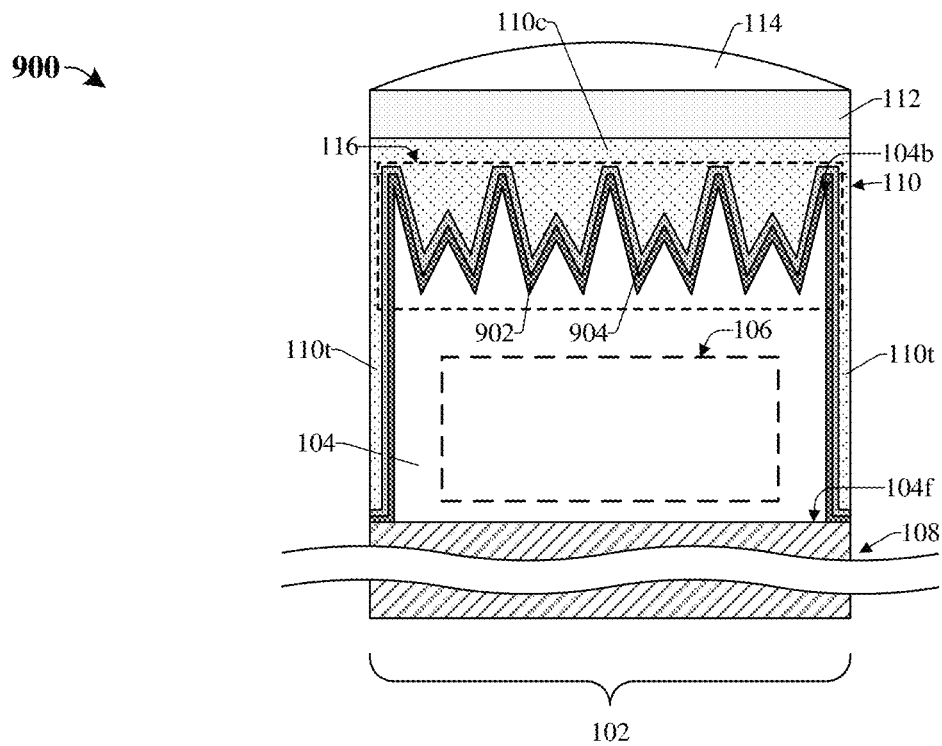
FIGS. 9A and 9B illustrate cross-sectional views of some embodiments of an image sensor comprising a passivation layer and an anti-reflective coating layer that extend along an absorption enhancement structure.
Figure 9B:
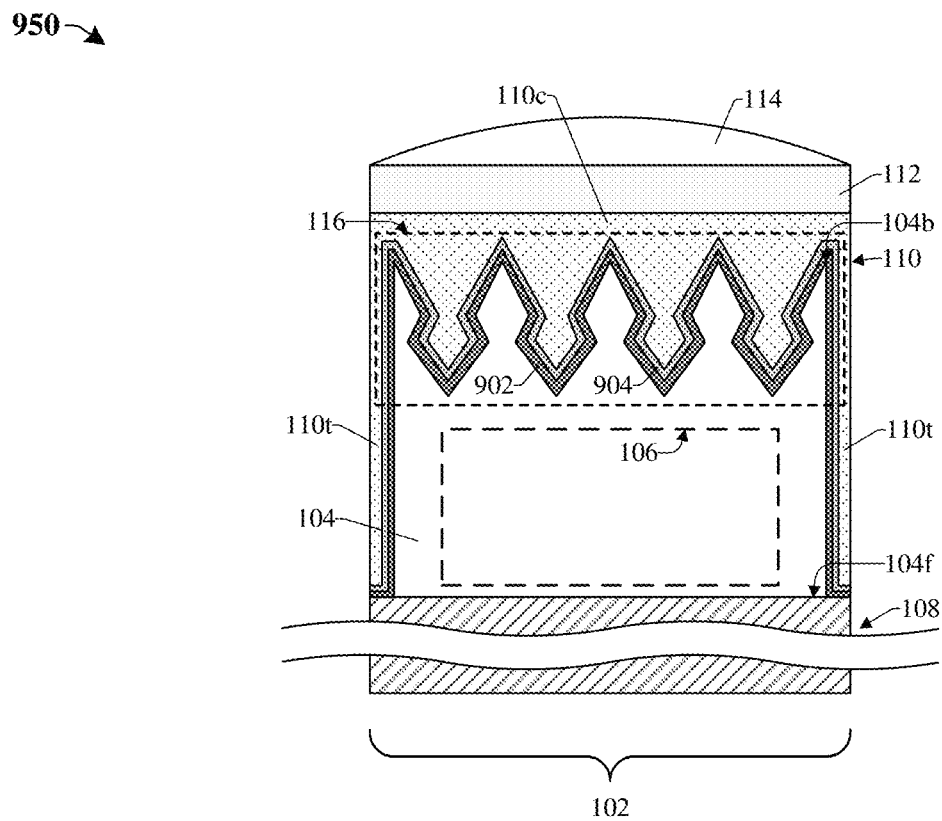

Referring to FIGS. 9A and 9B simultaneously, FIG. 9A and FIG. 9B illustrate cross-sectional views 900 and 950, respectively, of some embodiments of an image sensor comprising a passivation layer 902 and an anti-reflective layer 904 that extend along an absorption enhancement structure 116.

In such embodiments, the passivation layer 902 extends along the back-side 104b of the substrate 104 and the anti-reflective layer 904 extends along the passivation layer 902. In some embodiments, the passivation layer 902 and the anti-reflective layer 904 vertically separate the substrate 104 from an overlying dielectric structure 110. The passivation layer 902 may protect the substrate 104 from undesired chemical and/or physical reactions. Further, the anti-reflective layer 904 may reduce a reflectance of the substrate 104.

In some embodiments, the passivation layer 902 may, for example, comprise aluminum oxide, hafnium oxide, some other high-k dielectric, some other suitable material, or any combination of the foregoing.

In some embodiments, the anti-reflective layer 904 may, for example, comprise silicon oxide, silicon nitride, silicon oxynitride, aluminum oxide, aluminum nitride, hafnium oxide, tantalum oxide, some other suitable material, or any combination of the foregoing.

In some embodiments, the substrate 104 may, for example, comprise silicon, some III-V material, or some other suitable material. Further, the substrate 104 may, for example, have a thickness of about 6 to 7 micrometers or some other suitable thickness.

In some embodiments, the photodetector 106 may, for example, be or comprise a photodiode, an avalanche photodiode (APD), a single photon avalanche diode (SPAD), some other suitable photodetector, or the like. In some embodiments, the image sensor may, for example, be a CMOS image sensor (CIS), some other suitable image sensor, or the like.

In some embodiments, the dielectric structure 110 may, for example, comprise silicon oxide, silicon nitride, silicon oxynitride, some other suitable dielectric, or the like.

FIGS. 10, 12, 14, 16, 18, 20, 22, 24, and 26 illustrate cross-sectional views 1000, 1200, 1400, 1600, 1800, 2000, 2200, 2400, and 2600 of some embodiments of a method for forming an image sensor comprising an absorption enhancement structure 116, and FIGS. 11, 13, 15, 17A, 17B, 19A, 19B, 21, 23, 25, and 27 illustrate corresponding top views 1100, 1300, 1500, 1700, 1750, 1900, 1950, 2100, 2300, 2500, and 2700 of some embodiments of the method, respectively. Although FIGS. 10-27 are described in relation to a method, it will be appreciated that the structures disclosed in FIGS. 10-27 are not limited to such a method, but instead may stand alone as structures independent of the method.

Figure 10:
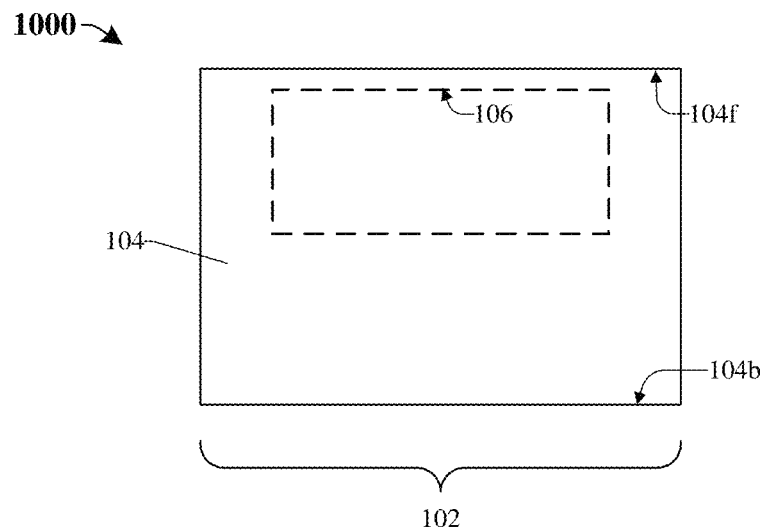
FIGS. 10-27 illustrate cross-sectional and top views of some embodiments of a method for forming an image sensor comprising an absorption enhancement structure.
Figure 11:
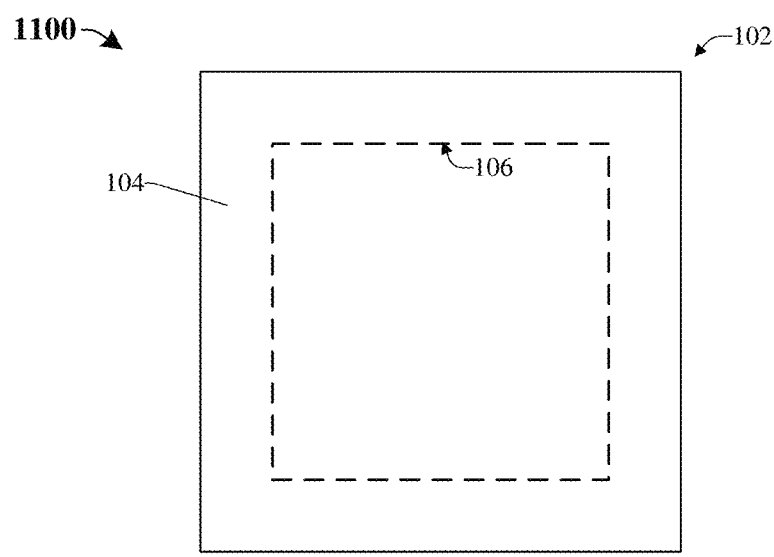

As shown in cross-sectional view 1000 of FIG. 10 and corresponding top view 1100 of FIG. 11, a pixel 102 is along a substrate 104. A photodetector 106 is formed in the substrate 104 along a front-side 104f of the substrate 104. The photodetector 106 may be formed by, for example, an ion implantation process or the like.

Figure 12:
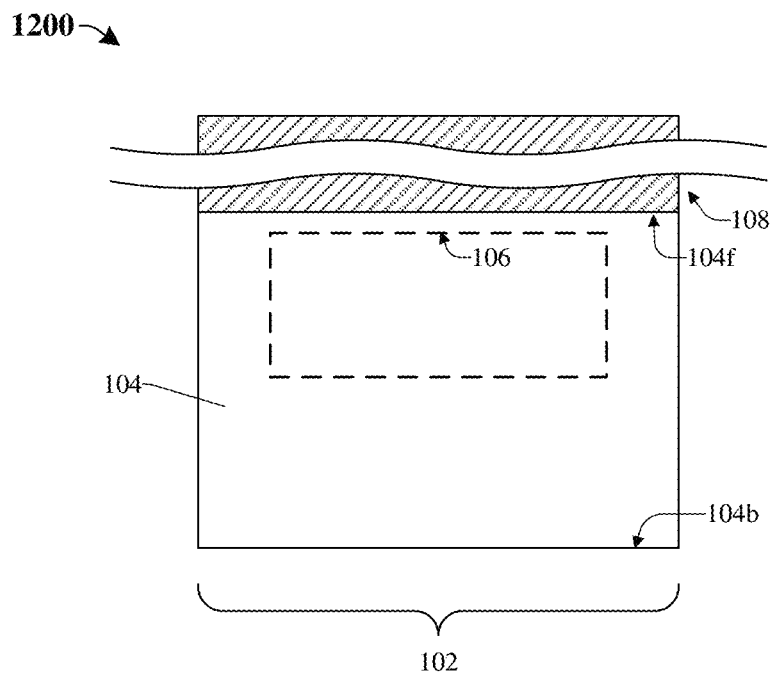
Figure 13:
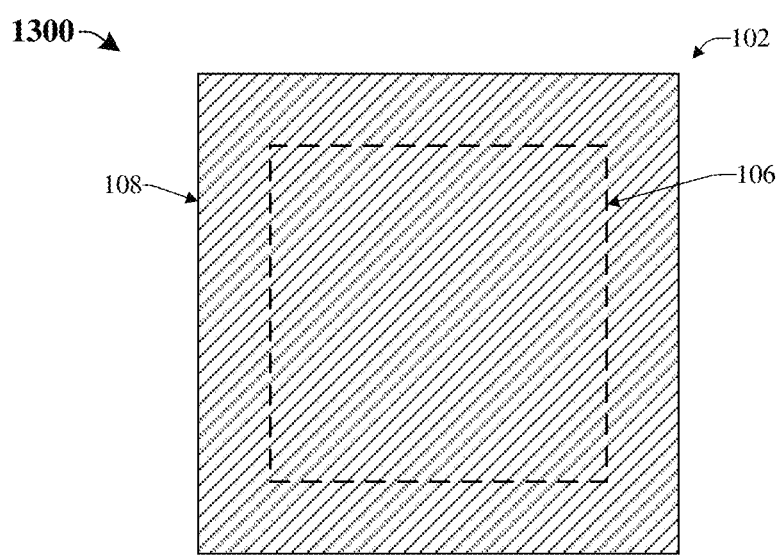

As shown in cross-sectional view 1200 of FIG. 12 and corresponding top view 1300 of FIG. 13, an interconnect structure 108 is formed over the front-side 104f of the substrate 104. The interconnect structure 108 may, for example, comprise any of metal lines, metal vias, contacts, solder bumps, bond pads, or the like. Further, the interconnect structure 108 may, for example, be formed by any of a lithography process, an etching process, a deposition process, a planarization process, or some other suitable process.

Figure 14:
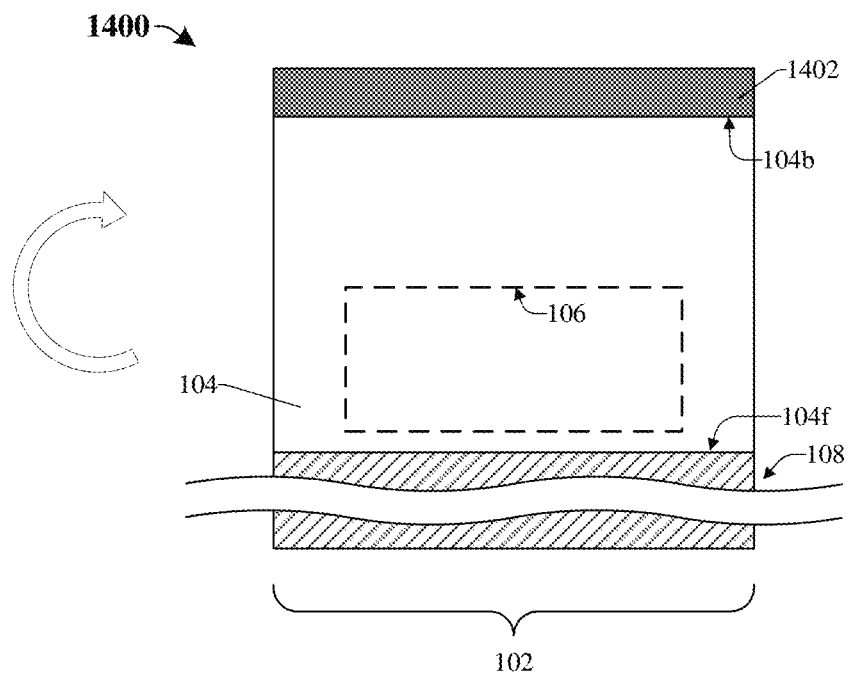
Figure 15:
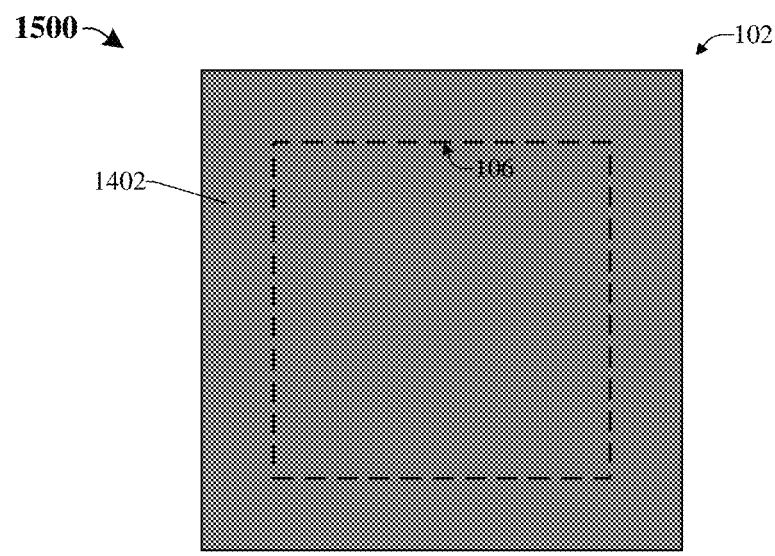

As shown in cross-sectional view 1400 of FIG. 14 and corresponding top view 1500 of FIG. 15, the substrate 104 is rotated as noted by the arrow. Further, a hard mask 1402 is formed over a back-side 104b of the substrate 104. The hard mask 1402 may, for example, be formed by depositing any of silicon oxide, silicon nitride, silicon oxynitride, or some other suitable material over the substrate 104 by a chemical vapor deposition (CVD) process, a physical vapor deposition (PVD) process, by an atomic layer deposition (ALD) process, a spin-on process, or some other suitable deposition process.

Figure 16:
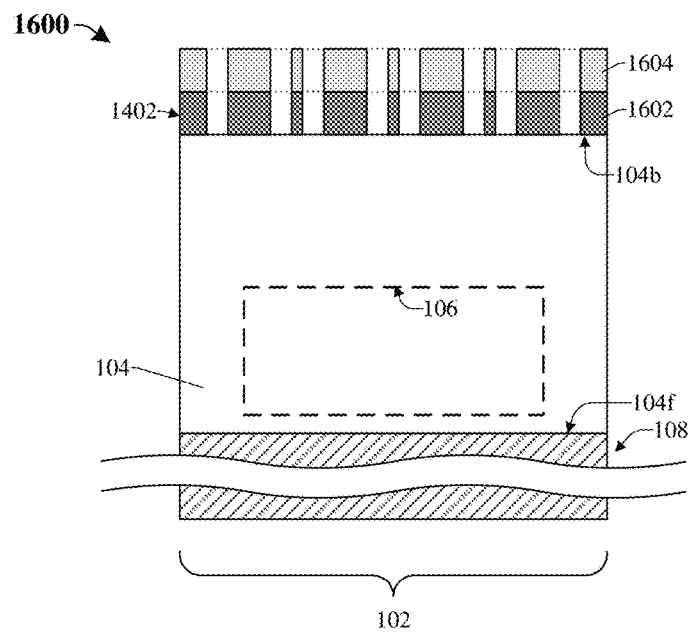
Figures 17A, 17B:
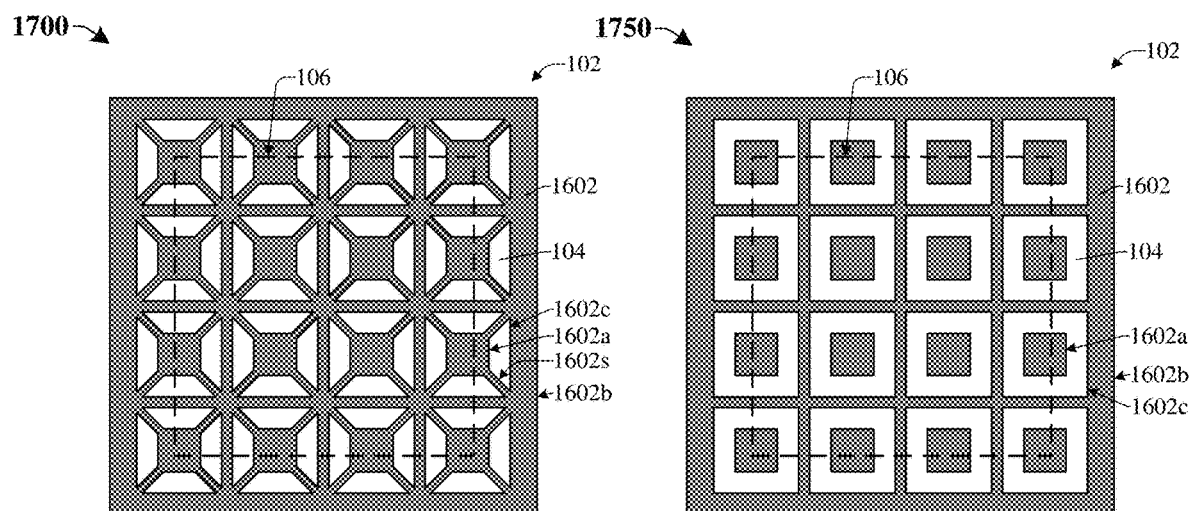

As shown in cross-sectional view 1600 of FIG. 16 and corresponding top views 1700 of FIG. 17A and 1750 of FIG. 17B, a photoresist mask 1604 is formed over the hard mask 1402 and the hard mask 1402 is patterned with the photoresist mask 1604 in place to define a patterned hard mask 1602. The patterning may, for example, comprise a wet etching process, a dry etching process, or some other suitable patterning process.

For example, a wet etching process may utilize any of hydrofluoric acid, potassium hydroxide, sodium hydroxide, tetramethylammonium hydroxide, ammonium hydroxide, or some other suitable wet etchant. Further, a dry etching process may, for example, comprise any of a plasma etching process, a reactive-ion etching (RIE) process, an ion beam etching (IBE) process, or some other suitable process.

In some embodiments (see, for example FIG. 17A), patterning the hard mask 1402 defines one or more first patterned hard mask regions 1602a and one or more second patterned hard mask regions 1602b that laterally surround the one or more first patterned hard mask regions 1602a. The first patterned hard mask region 1602a is separated from the second hard mask region 1602b by one or more openings 1602c in the patterned hard mask 1602. The patterning further defines a plurality of patterned hard mask segments 1602s that extend between corners of the one or more first patterned hard mask regions 1602a and corners of the one or more second patterned hard mask regions 1602b. The plurality of patterned hard mask segments 1602s join the one or more first patterned hard mask regions 1602a to the one or more second patterned hard mask regions 1602b such that the patterned hard mask 1602 extends continuously from the one or more first patterned hard mask regions 1602a to the one or more second patterned hard mask regions 1602b via the plurality of patterned hard mask segments 1602s.

In other words, in such embodiments, the photoresist mask 1604 may have a series of x-shaped patterns with respective square-shaped regions centered on the x-shaped patterns.

In some alternative embodiments (see, for example, FIG. 17B), the patterning defines one or more first patterned hard mask regions 1602a and one or more second patterned hard mask regions 1602b that laterally surround the one or more first patterned hard mask regions 1602a. The one or more first patterned hard mask regions 1602a are laterally separated from the one or more second patterned hard mask regions 1602b by one or more openings 1602c in the patterned hard mask 1602 that surround the one or more first patterned hard mask regions 1602a.

In other words, in such embodiments, the photoresist mask 1604 may alternatively have a series of square-shaped regions that are separated from a grid pattern.

It should be noted that the photoresist mask 1604 is not shown in FIGS. 17A and 17B for illustrative purposes.

Figure 18:
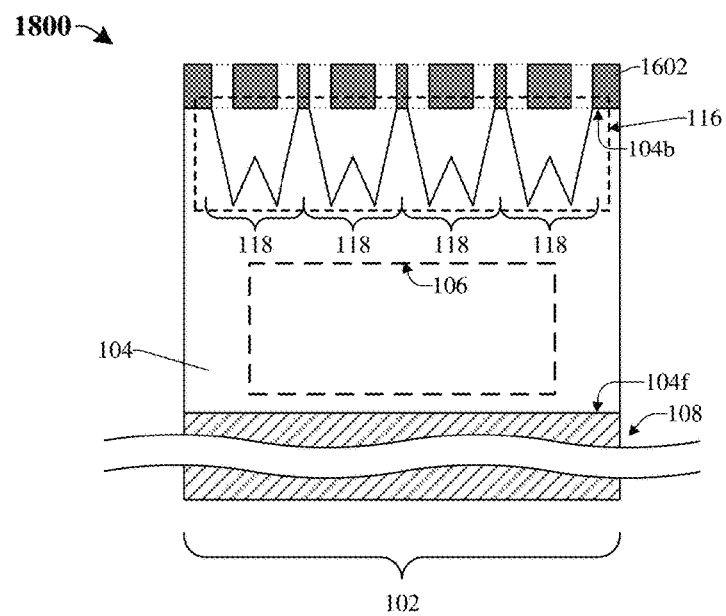
Figures 19A, 19B:
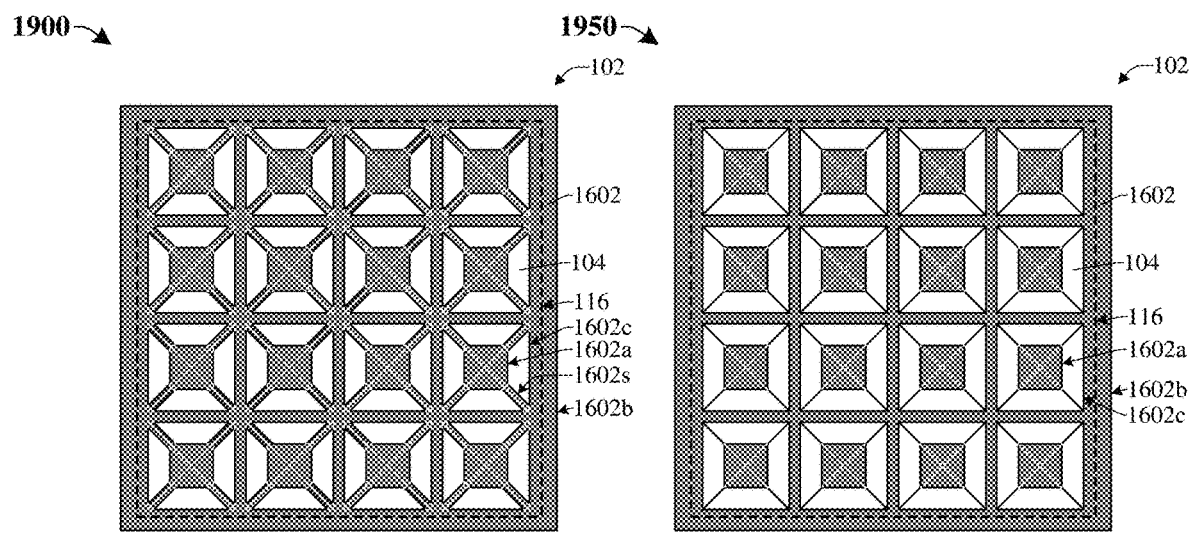

As shown in cross-sectional view 1800 of FIG. 18 and corresponding top views 1900 of FIG. 19A and 1950 of FIG. 19B, the back-side 104b of the substrate 104 is patterned with the patterned hard mask 1602 in place to define one or more substrate depressions 118 along the back-side of the substrate 104. The one or more substrate depression 118 establish an absorption enhancement structure 116 that is configured to reduce an overall reflectance of the substrate 104 and thus improve a performance of the image sensor.

In some embodiments, the patterning may comprise a wet etching process, a dry etching process, or some other suitable patterning process. For example, the wet etching process may utilize potassium hydroxide, sodium hydroxide, tetramethylammonium hydroxide, ammonium hydroxide, or some other suitable wet etchant. In some embodiments, the patterned hard mask 1602 may be removed after the patterning.

In some embodiments (see, for example, FIG. 19A), the patterned hard mask 1602 remains in place during the patterning.

In some alternative embodiments (see, for example, FIG. 19B), the one or more first patterned hard mask regions 1602a may be removed or washed away during the patterning. For example, since the one or more first patterned hard mask regions 1602a illustrated in FIG. 19B are separated from the one or more second patterned hard mask regions 1602b, the one or more first patterned hard mask regions 1602a may be removed or washed away during the etching process once the etch substantially undercuts the one or more first patterned hard mask regions 1602a. In some embodiments, the etching process may continue for a period of time after the one or more first patterned hard mask regions 1602a have been removed, while in some other embodiments, the etching process may stop once the one or more first patterned hard mask regions 1602a have been removed. In some embodiments, the one or more first patterned hard mask regions 1602a are removed before the one or more second patterned hard mask regions 1602b are removed.

Figure 20:
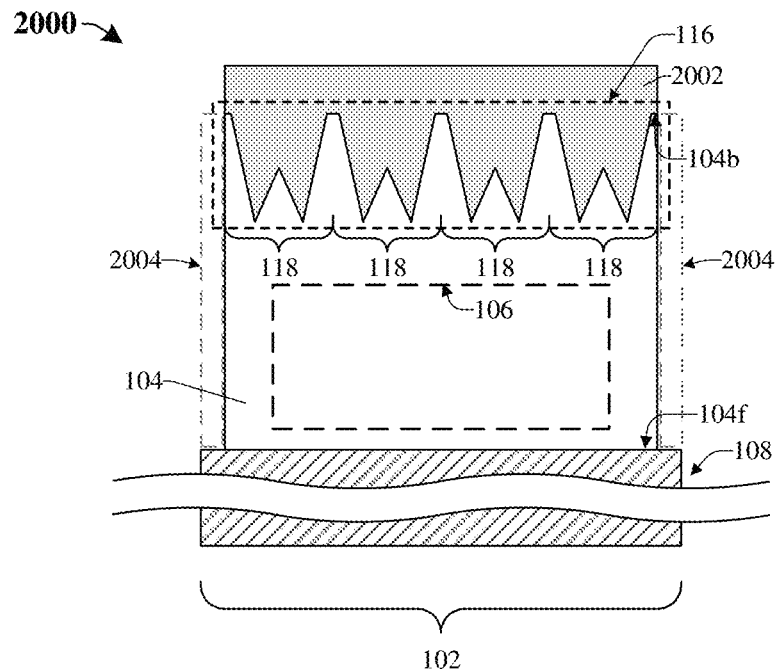
Figure 21:
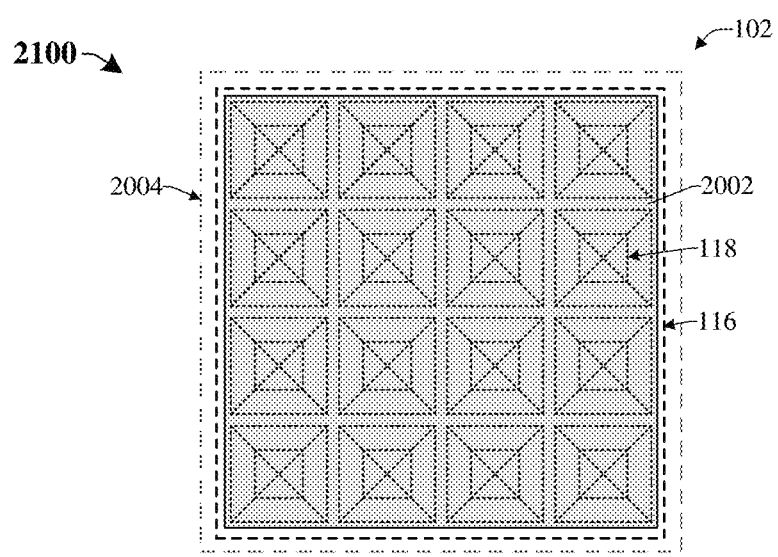

As shown in cross-sectional view 2000 of FIG. 20 and corresponding top view 2100 of FIG. 21, a photoresist mask 2002 is formed over the back-side of the substrate 104. In some embodiments, the photoresist mask 2002 is formed over the absorption enhancement structure 116. The substrate 104 is the patterned with the photoresist mask 2002 in place to form openings 2004 in the substrate 104 that surround the photodetector 106 along a boundary of the pixel 102. The patterning may comprise a wet etching process, a dry etching process, or some other suitable patterning process.

Figure 22:
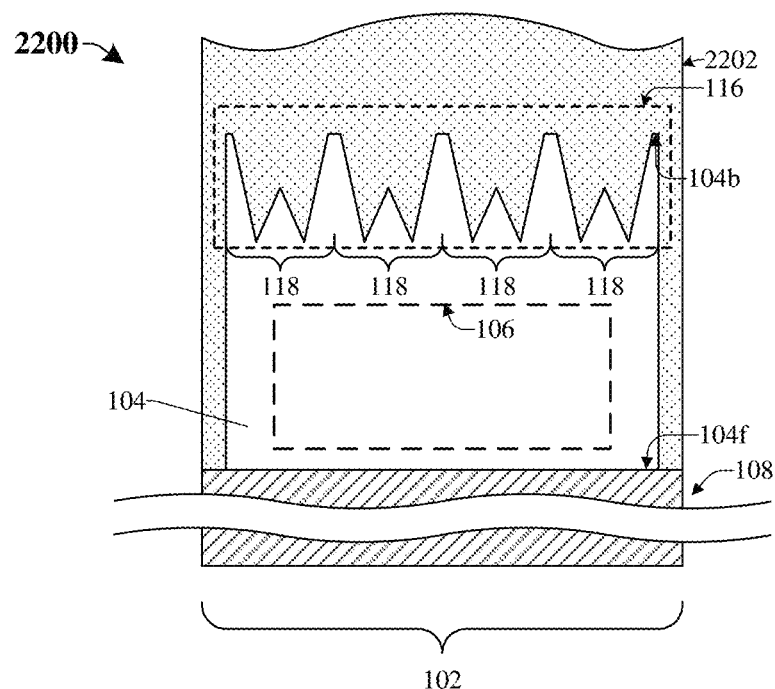
Figure 23:
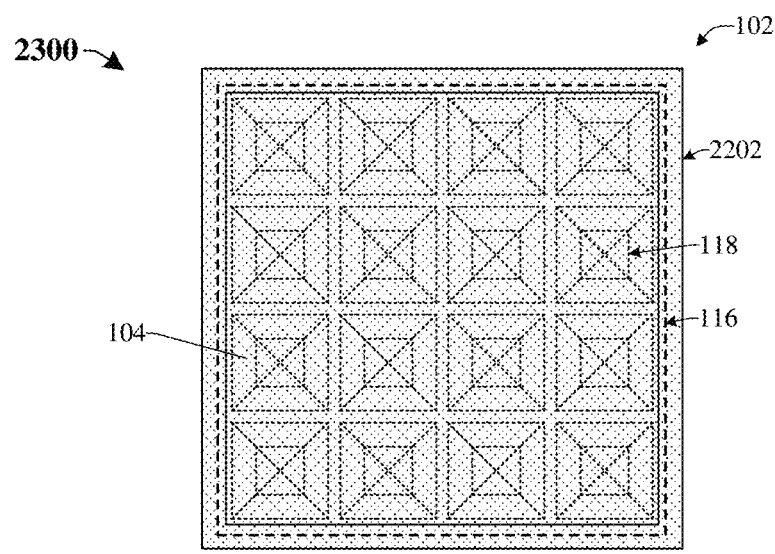

As shown in cross-sectional view 2200 of FIG. 22 and corresponding top view 2300 of FIG. 23, a dielectric material 2202 is formed over the back-side 104b of the substrate 104. The dielectric material 2202 may, for example, be formed by depositing any of silicon oxide, silicon nitride, silicon oxynitride, or some other suitable dielectric over the substrate 104 by a CVD process, a PVD process, an ALD process, a spin-on process, or some other suitable deposition process.

Figure 24:
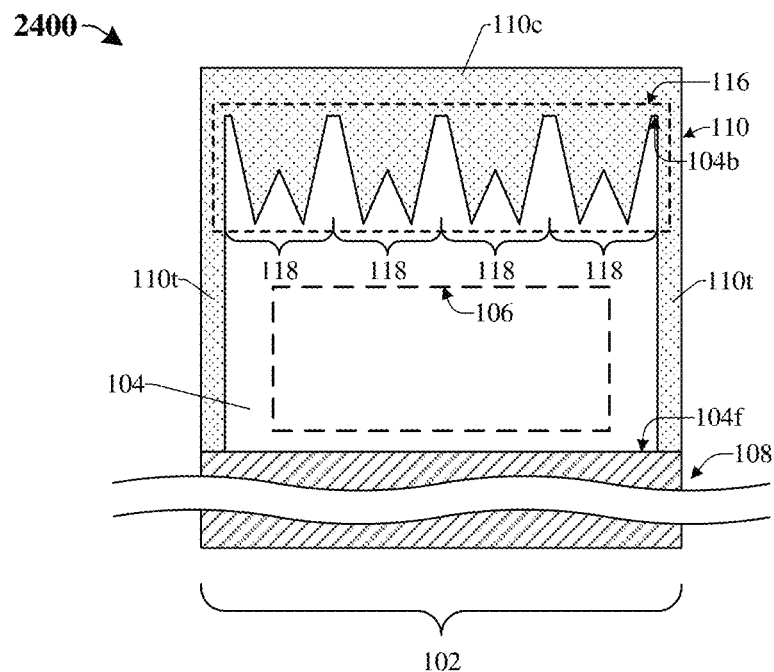
Figure 25:
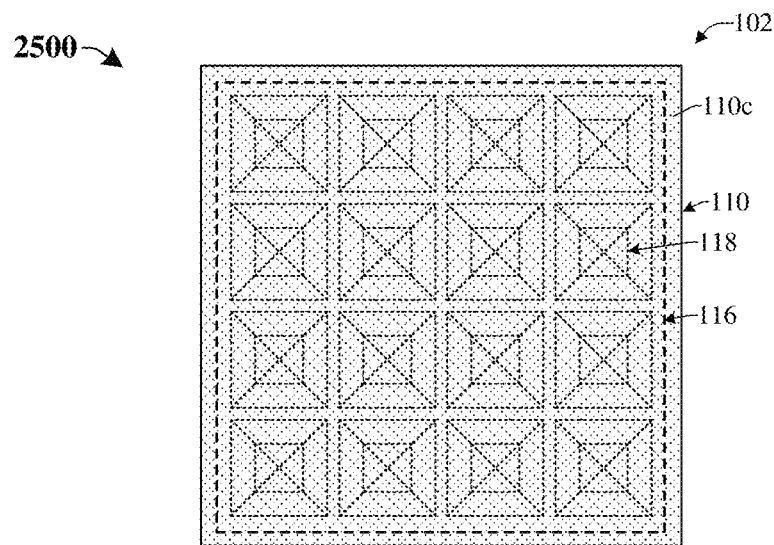

As shown in cross-sectional view 2400 of FIG. 24 and corresponding top view 2500 of FIG. 25, a planarization process is performed into the dielectric material 2202 to define a dielectric structure 110. The dielectric structure 110 comprises a trench region 110t that surrounds the photodetector 106 along a boundary of the pixel 102 and that isolates the pixel 102 from neighboring pixels (not shown). Further, the dielectric structure 110 comprises a cap region 110c that extends over the back-side 104b of the substrate 104.

Figure 26:
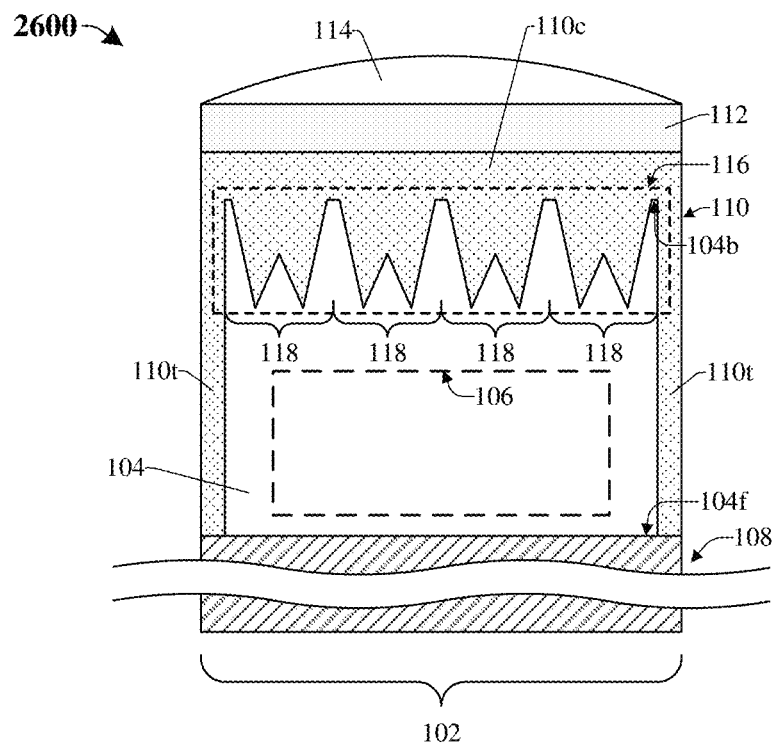
Figure 27:
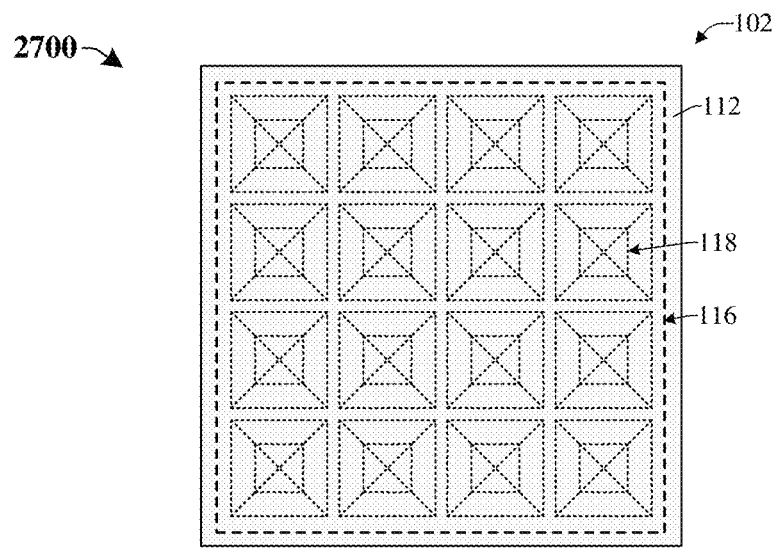

As shown in cross-sectional view 2600 of FIG. 26 and corresponding top view 2700 of FIG. 27, a color filter 112 and a lens 114 are formed over the cap region 110c of the dielectric structure 110 and along the back-side 104b of the substrate 104.

Figure 28:
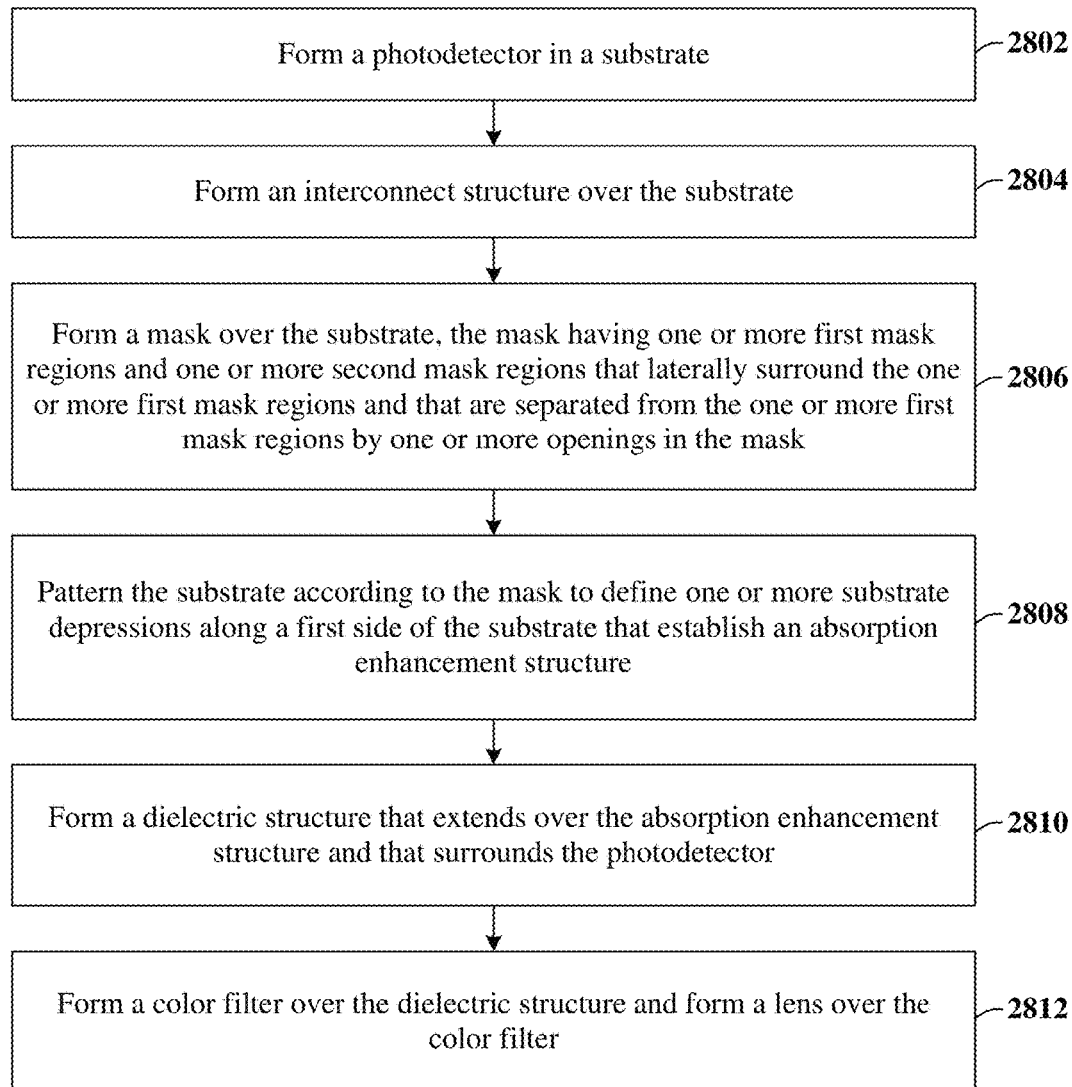
FIG. 28 illustrates a flow diagram of some embodiments of a method for forming an image sensor comprising an absorption enhancement structure.

FIG. 28 illustrates a flow diagram of some embodiments of a method 2800 for forming an image sensor comprising an absorption enhancement structure. While method 2800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2802, a photodetector is formed in a substrate. FIGS. 10 and 11 illustrate a cross-sectional view 1000 and a top view 1100, respectively, of some embodiments corresponding to act 2802.

At 2804, an interconnect structure is formed over the substrate. FIGS. 12 and 13 illustrate a cross-sectional view 1200 and a top view 1300, respectively, of some embodiments corresponding to act 2804.

At 2806, a mask is formed over the substrate, the mask having one or more first mask regions and one or more second mask regions that laterally surround the one or more first mask regions and that are separated from the one or more first mask regions by one or more openings in the mask. FIGS. 16, 17A, and 17B illustrate a cross-sectional view 1600 and top views 1700 and 1750, respectively, of some embodiments corresponding to act 2806.

At 2808, the substrate is patterned according to the mask to define one or more substrate depressions along a first side of the substrate that establish an absorption enhancement structure. FIGS. 18 and 19 illustrate a cross-sectional view 1800 and a top view 1900, respectively, of some embodiments corresponding to act 2808.

At 2810, a dielectric structure that extends over the absorption enhancement structure and that surrounds the photodetector is formed. FIGS. 24 and 25 illustrate a cross-sectional view 2400 and a top view 2500, respectively, of some embodiments corresponding to act 2810.

At 2812, a color filter is formed over the dielectric structure and a lens is formed over the color filter. FIGS. 26 and 27 illustrate a cross-sectional view 2600 and a top view 2700, respectively, of some embodiments corresponding to act 2812.

FIGS. 29, 31, 33, 35, 37, 39, 41, 43, 45, 47, 49, and 51 illustrate cross-sectional views 2900, 3100, 3300, 3500, 3700, 3900, 4100, 4300, 4500, 4700, 4900, and 5100 of some other embodiments of a method for forming an image sensor comprising an absorption enhancement structure 116, and FIGS. 30, 32, 34, 36, 38, 40, 42, 44, 46, 48, 50, and 52 illustrate corresponding top views 3000, 3200, 3400, 3600, 3800, 4000, 4200, 4400, 4600, 4800, 5000, and 5200 of some embodiments of the method, respectively. Although FIGS. 29-52 are described in relation to a method, it will be appreciated that the structures disclosed in FIGS. 29-52 are not limited to such a method, but instead may stand alone as structures independent of the method.

Figure 29:
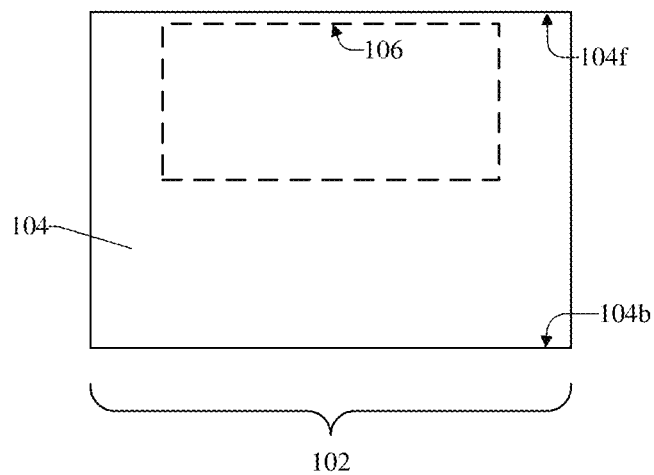
FIGS. 29-52 illustrate cross-sectional and top views of some other embodiments of a method for forming an image sensor comprising an absorption enhancement structure.
Figure 30:
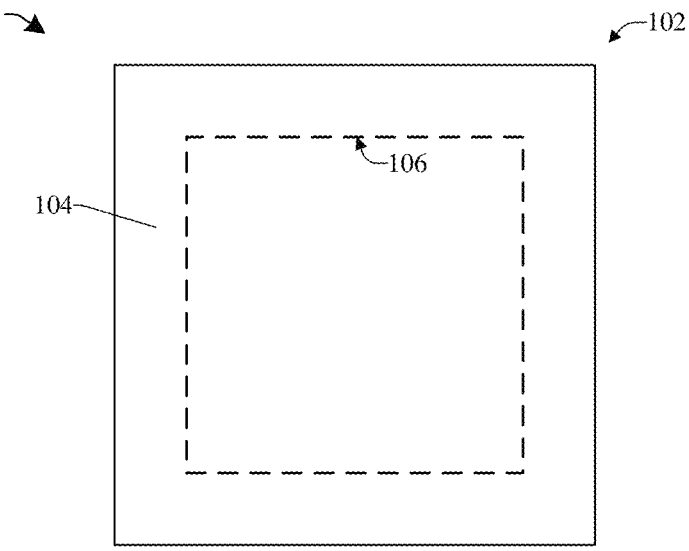
Figure 31:
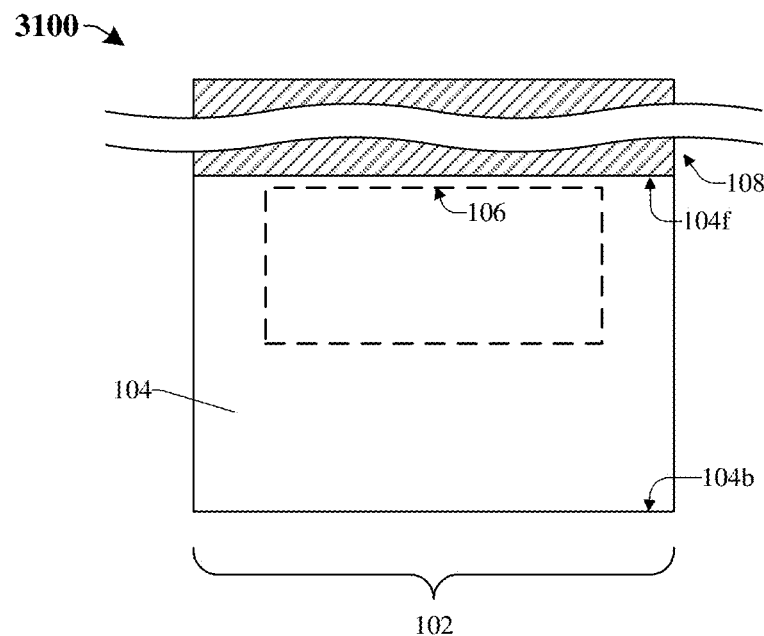
Figure 32:
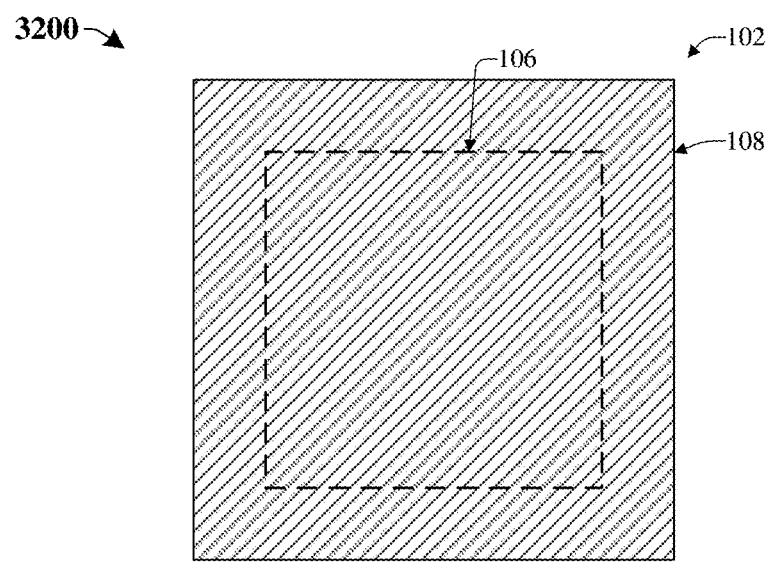
Figure 33:
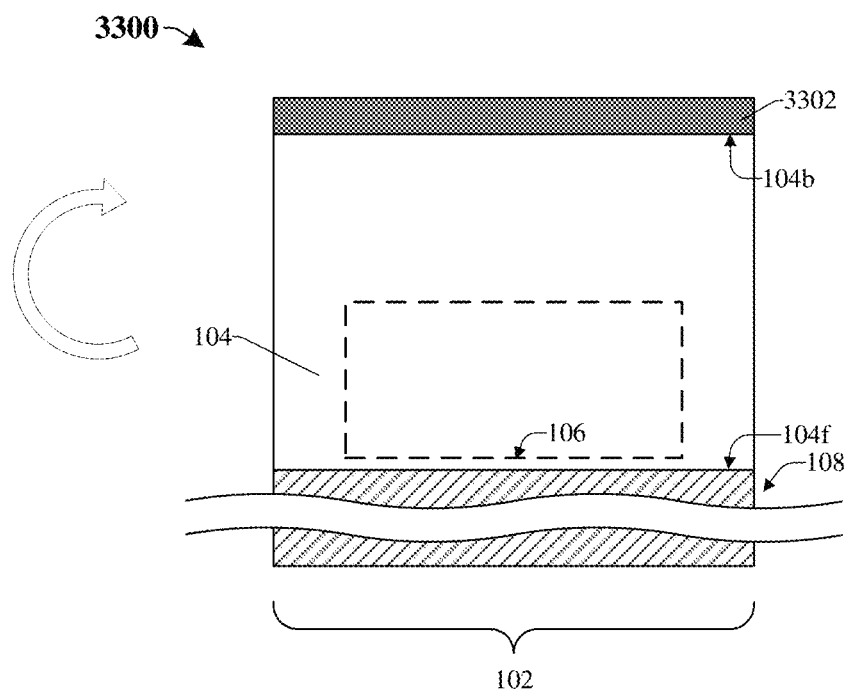
Figure 34:
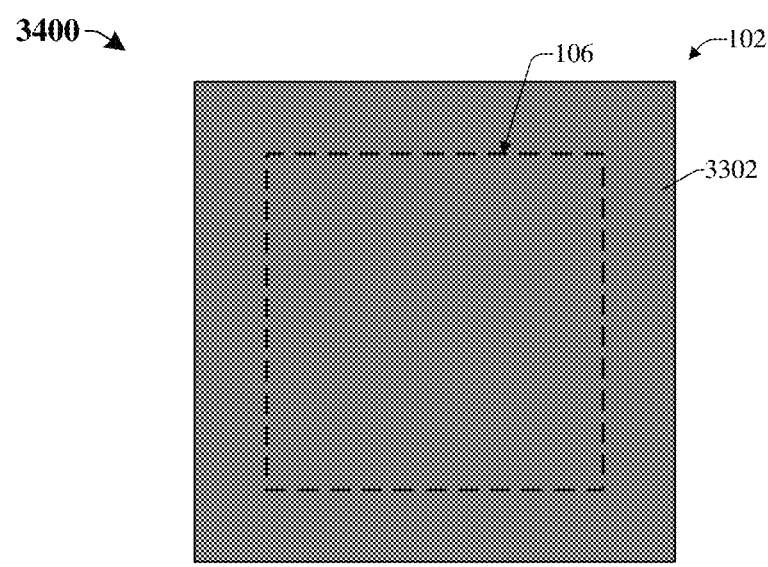

Cross-sectional views 2900, 3100, and 3300 of FIGS. 29, 31, and 33 and corresponding top views 3000, 3200, and 3400 of FIGS. 30, 32, and 34 illustrate a method that is similar to that which is illustrated in cross-sectional views 1000, 1200, and 1400 of FIGS. 10, 12, and 14, and in corresponding top views 1100, 1300, and 1500 of FIGS. 11, 13, and 15, respectively.

For example, as illustrated in FIGS. 29 and 30, a photodetector 106 is formed in a substrate 104. Further, as illustrated in FIGS. 31 and 32, an interconnect structure 108 is formed along a front-side 104f of the substrate 104.

Furthermore, as illustrated in FIGS. 33 and 34, the substrate 104 is rotated and a hard mask 3302 is formed on a back-side 104b of the substrate 104.

Figure 35:
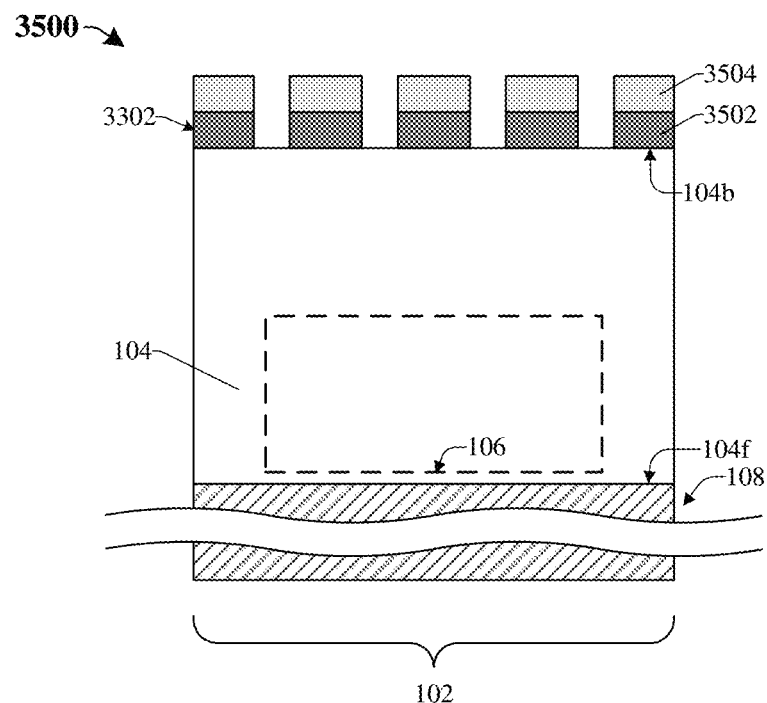
Figure 36:
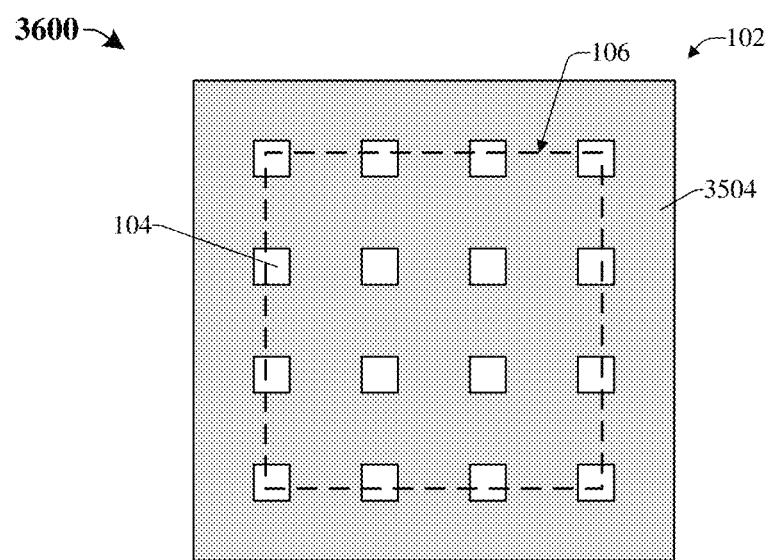

As shown in cross-sectional view 3500 of FIG. 35 and corresponding top view 3600 of FIG. 36, a photoresist mask 3504 is formed over the hard mask 3302 and the hard mask 3302 is patterned with the photoresist mask 3504 in place to define a patterned hard mask 3502. The photoresist mask 3504 may have a series of square-shaped openings, as seen in FIG. 36. In some other embodiments (not shown), the openings may have a different shape (e.g., triangle-shaped, circle-shaped, or the like).

The patterning may comprise a wet etching process, a dry etching process, or some other suitable patterning process. For example, a wet etching process may utilize any of hydrofluoric acid, potassium hydroxide, sodium hydroxide, tetramethylammonium hydroxide, ammonium hydroxide, or some other suitable wet etchant. Further, a dry etching process may, for example, comprise any of a plasma etching process, an RIE process, an IBE process, or some other suitable process.

Figure 37:
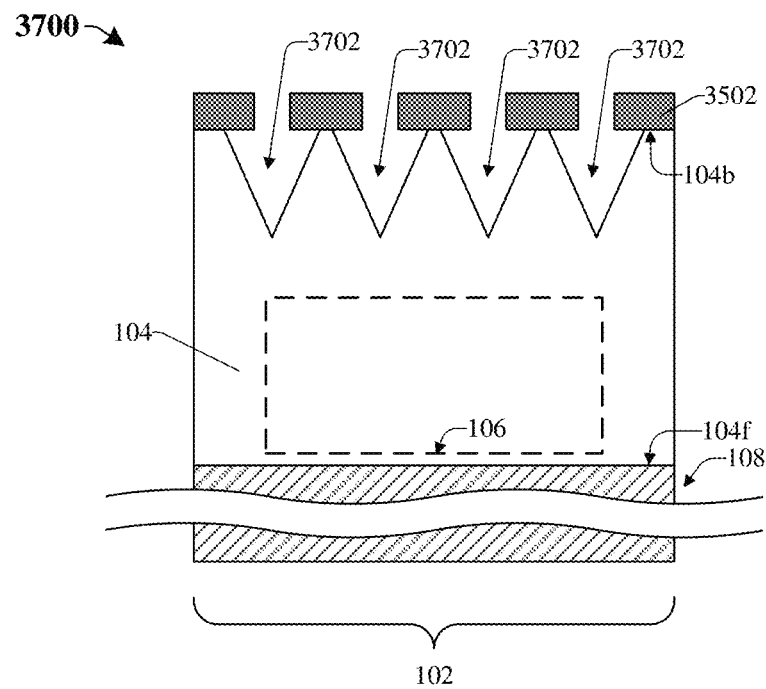
Figure 38:
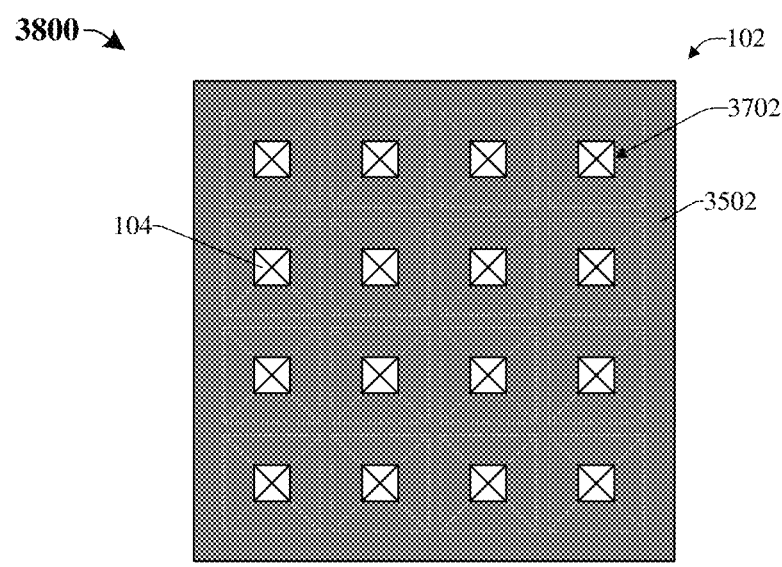

As shown in cross-sectional view 3700 of FIG. 37 and corresponding top view 3800 of FIG. 38, the back-side 104b of the substrate 104 is patterned with the patterned hard mask 3502 in place to form one or more first recesses 3702 in the substrate 104. The one or more first recesses 3702 may have an inverted pyramid-like shape. However, it will be appreciated that the one or more first recesses 3702 may alternatively have a different shape (e.g., an invented cone-like shape or the like).

The patterning may comprise a first etching process. The first etching process may comprise a wet etching process, a dry etching process, or some other suitable etching process. For example, a wet etching process may utilize any of hydrofluoric acid, potassium hydroxide, sodium hydroxide, tetramethylammonium hydroxide, ammonium hydroxide, or some other suitable wet etchant. Further, a dry etching process may, for example, comprise a plasma etching process, an RIE process, an IBE process, or some other suitable process, and may utilize any of tetrafluoromethane (e.g., $CF_4$), trifluoromethane (e.g., $CHF_3$), difluoromethane (e.g., $CH_2F_2$), octafluorocyclobutane (e.g., $C_4F_8$).

Figure 39:
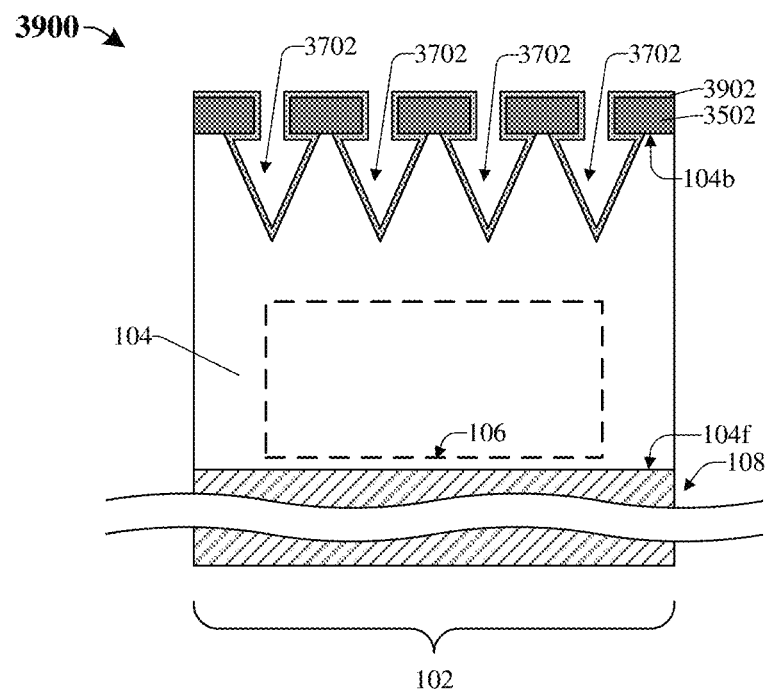
Figure 40:
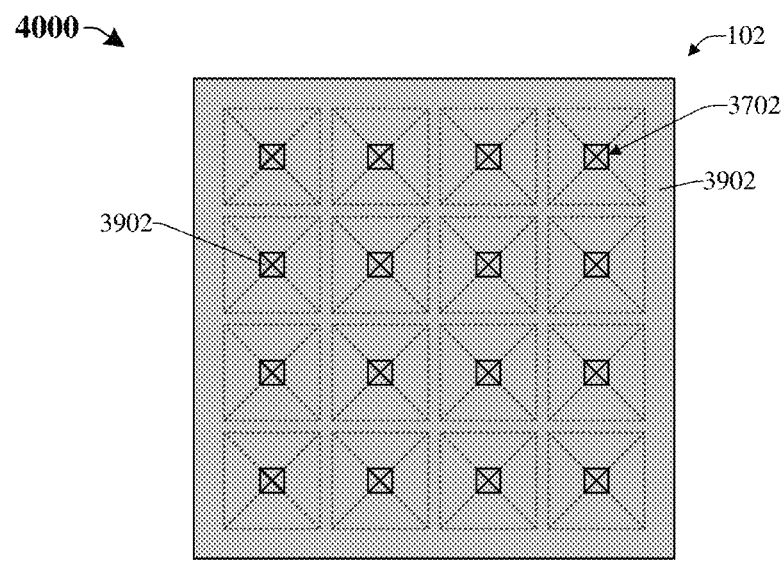

As shown in cross-sectional view 3900 of FIG. 39 and corresponding top view 4000 of FIG. 40, a dielectric liner layer 3902 is conformally formed on sidewalls of the substrate 104 that define the one or more first recesses 3702, on lower surfaces of the patterned hard mask 3502, on sidewalls of the patterned hard mask 3502, and on upper surfaces of the patterned hard mask 3502. The dielectric liner layer 3902 may, for example, be formed by depositing any of silicon oxide, aluminum oxide, hafnium oxide, zinc oxide, titanium oxide, tantalum oxide, or some other suitable dielectric over the substrate 104 by a CVD process, a PVD process, an ALD process, a spin-on process, or some other suitable deposition process.

Figure 41:
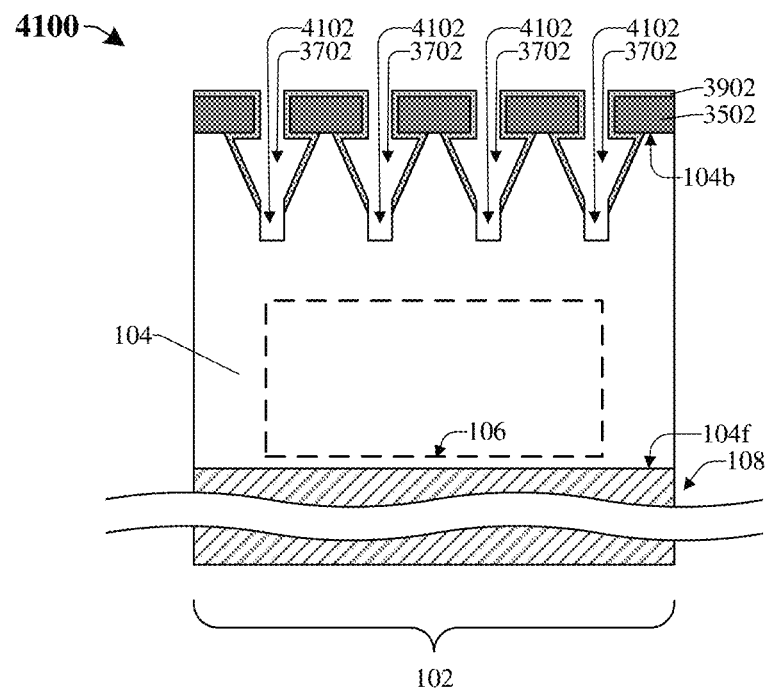
Figure 42:
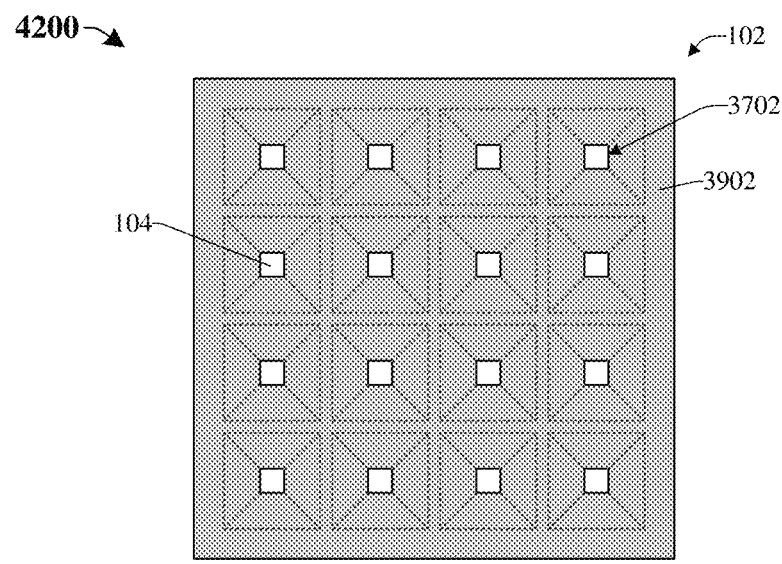

As shown in cross-sectional view 4100 of FIG. 41 and corresponding top view 4200 of FIG. 42, the dielectric liner layer 3902 and the substrate 104 are patterned to form one or more second recesses 4102 in the substrate 104 that are directly below the one or more first recesses 3702. The one or more second recesses 4102 may have a cube-like shape. However, it will be appreciated that the one or more second recesses 4102 may alternatively have a different shape (e.g., a cylinder-like shape or the like).

The patterning may comprise a second etching process. The second etching process may comprise a wet etching process, a dry etching process, or some other suitable etching process. For example, a wet etching process may utilize any of hydrofluoric acid, potassium hydroxide, sodium hydroxide, tetramethylammonium hydroxide, ammonium hydroxide, or some other suitable wet etchant. Further, a dry etching process may, for example, comprise a plasma etching process, an RIE process, an IBE process, or some other suitable process, and may utilize any of tetrafluoromethane (e.g., $CF_4$), trifluoromethane (e.g., $CHF_3$), difluoromethane (e.g., $CH_2F_2$), octafluorocyclobutane (e.g., $C_4F_8$).

Figure 43:
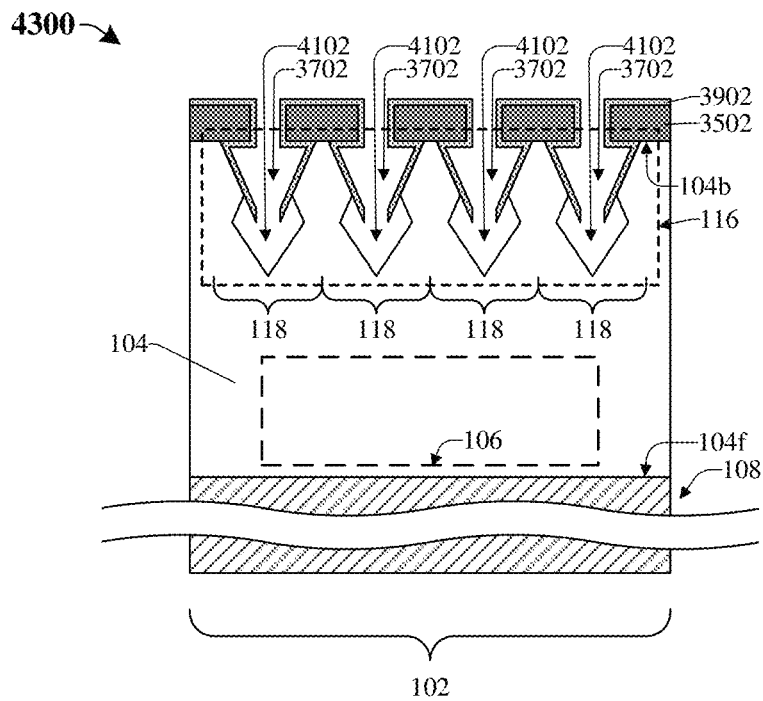
Figure 44:
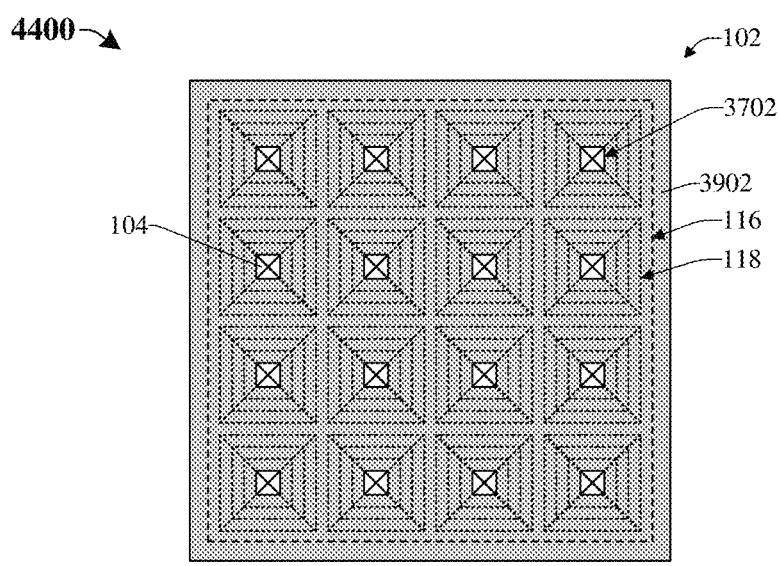

As shown in cross-sectional view 4300 of FIG. 43 and corresponding top view 4400 of FIG. 44, the substrate 104 is patterned to expand the one or more second recesses 4102 in vertical and lateral directions. In some embodiments, the patterning defines one or more substrate depressions 118 that establish an absorption enhancement structure 116.

The expanded one or more second recesses 4102 may have an inverted pyramid-like shape. However, it will be appreciated that the expanded one or more second recesses 4102 may alternatively have a different shape (e.g., an inverted cone-like shape or the like).

The patterning may comprise a third etching process. The third etching process may comprise a wet etching process, a dry etching process, or some other suitable etching process. For example, a wet etching process may utilize any of hydrofluoric acid, potassium hydroxide, sodium hydroxide, tetramethylammonium hydroxide, ammonium hydroxide, or some other suitable wet etchant. Further, a dry etching process may, for example, comprise a plasma etching process, an RIE process, an IBE process, or some other suitable process, and may utilize any of tetrafluoromethane (e.g., $CF_4$), trifluoromethane (e.g., $CHF_3$), difluoromethane (e.g., $CH_2F_2$), octafluorocyclobutane (e.g., $C_4F_8$).

Cross-sectional views 4500, 4700, 4900, and 5100 of FIGS. 45, 47, 49, and 51 and corresponding top views 4600, 4800, 5000, and 5200 of FIGS. 46, 48, 50, and 52 illustrate a method that is similar to that which is illustrated in cross-sectional views 2000, 2200, 2400, and 2600 of FIGS. 20, 22, 24, and 26, and in corresponding top views 2100, 2300, 2500, and 2700 of FIGS. 21, 23, 25, and 17, respectively.

Figure 45:
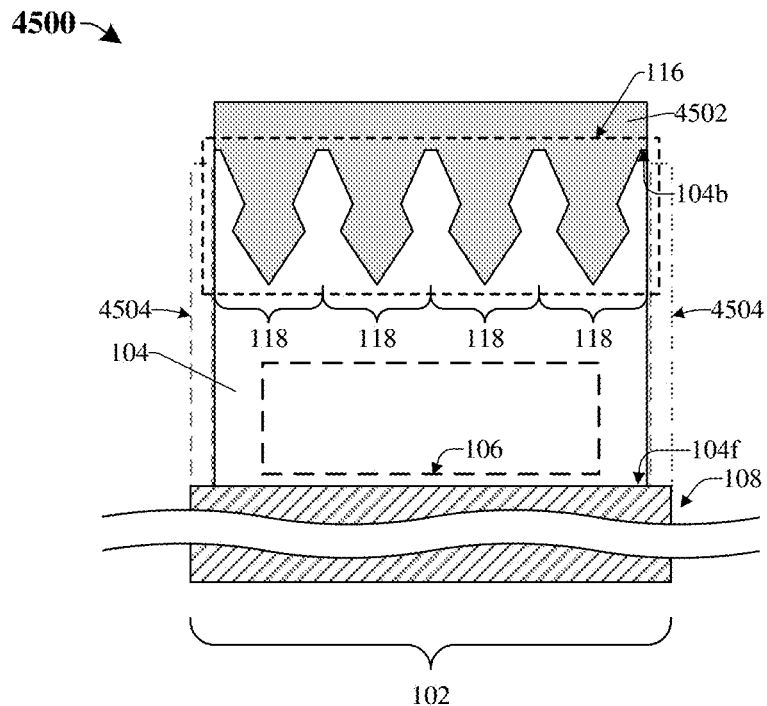
Figure 46:
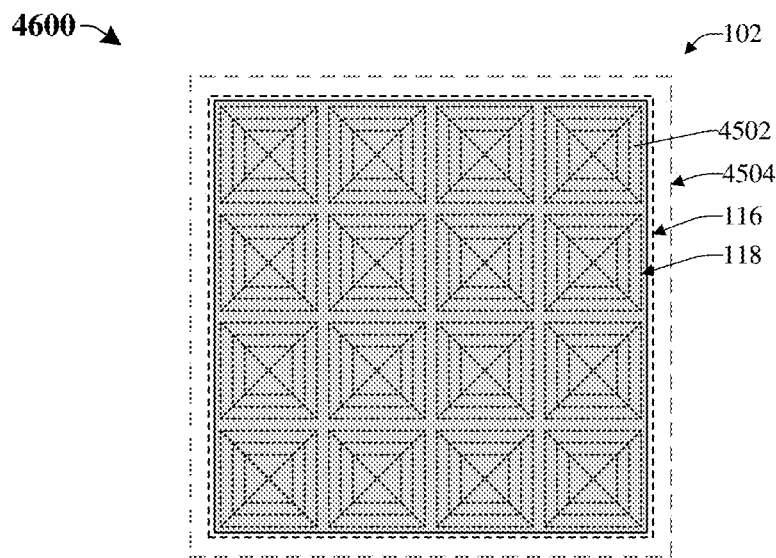
Figure 47:
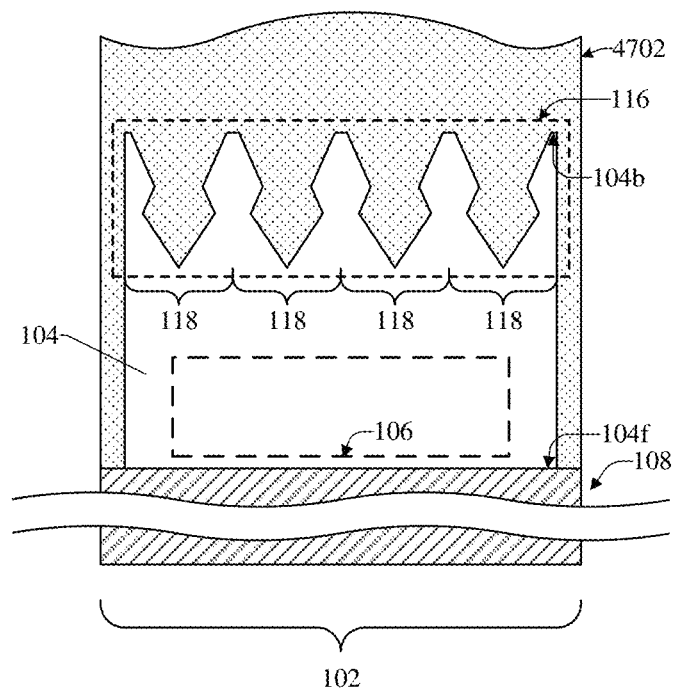
Figure 48:
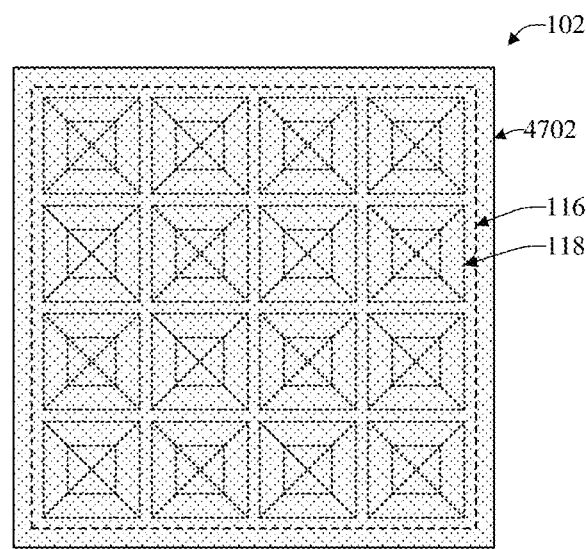
Figure 49:
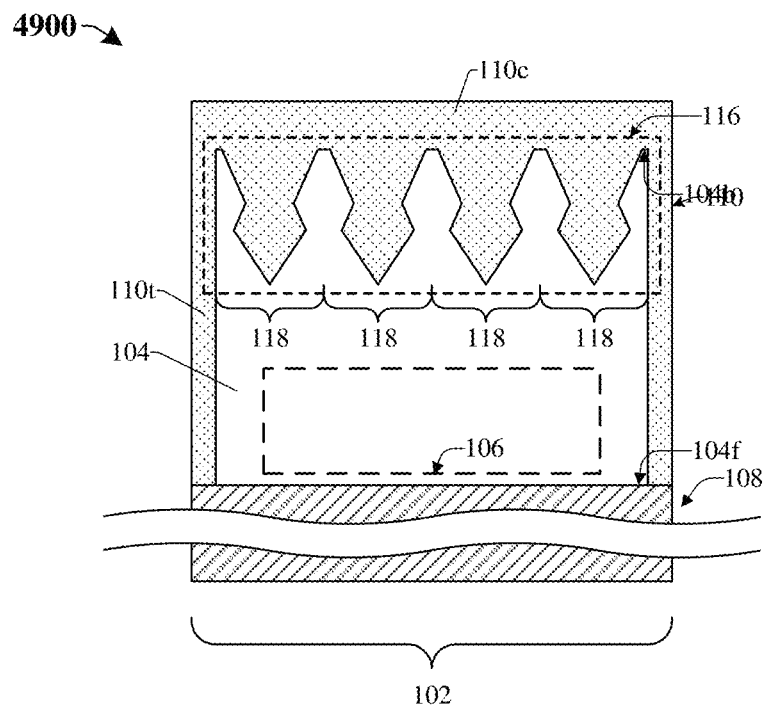
Figure 50:
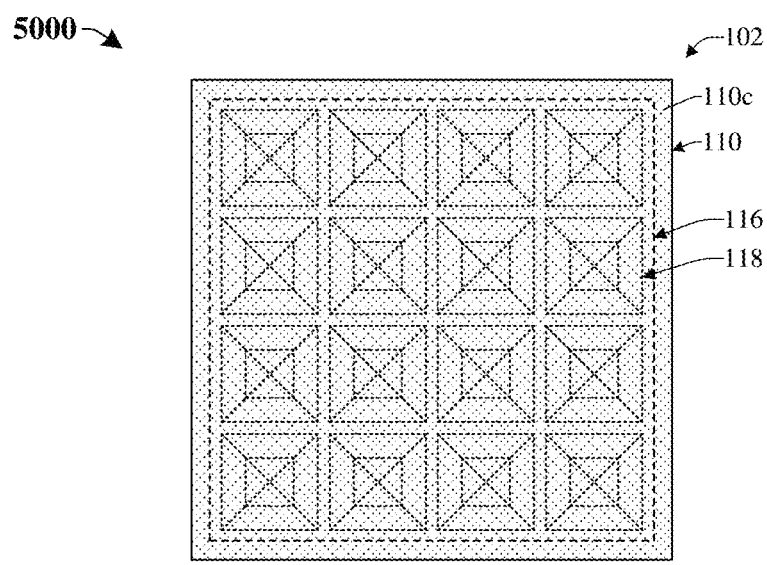
Figure 51:
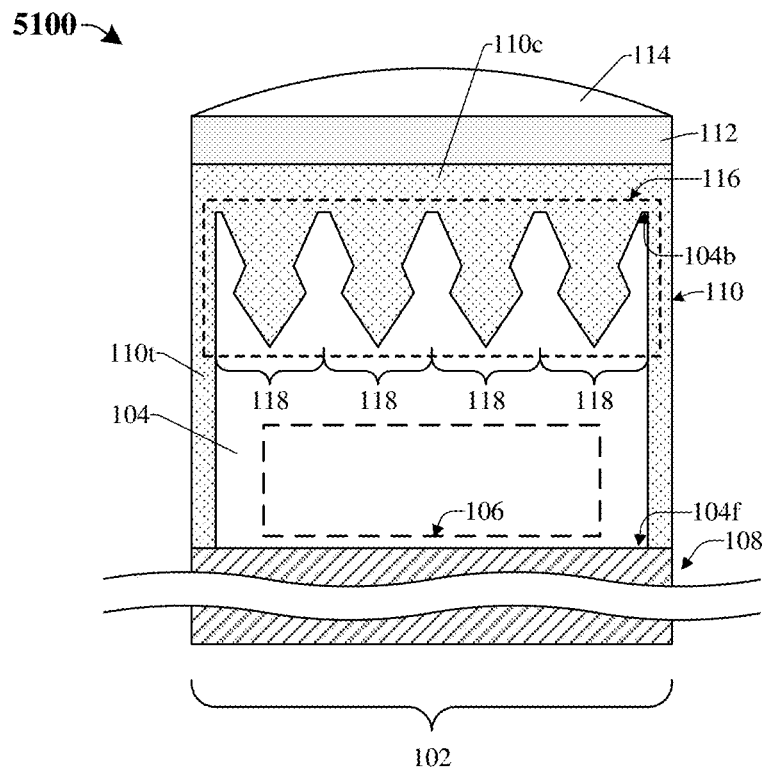
Figure 52:
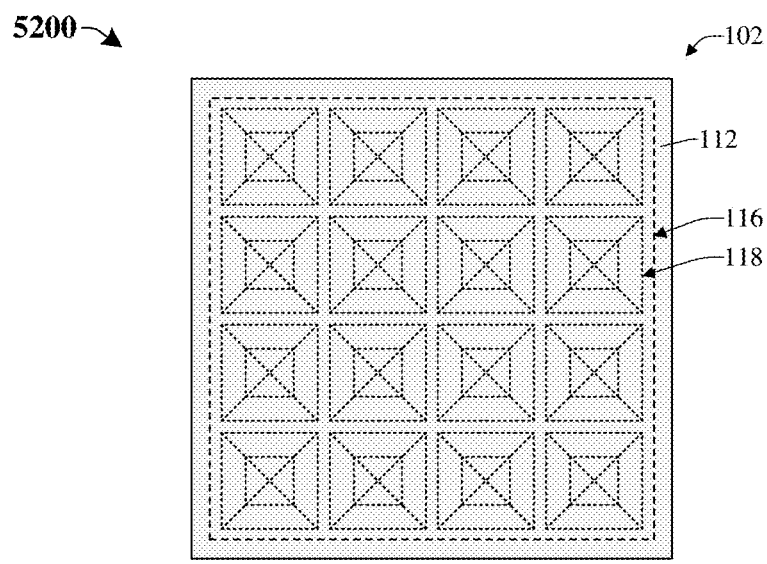

For example, as illustrated in FIGS. 45 and 46, a photoresist mask 4502 is formed over the substrate 104 and the substrate 104 is the patterned with the photoresist mask 4502 in place to form openings 4504 in the substrate 104 that surround the photodetector 106 along a boundary of the pixel 102. Next, as illustrated in FIGS. 47 and 48, a dielectric material 4702 is formed over the back-side 104b of the substrate 104. Further, as illustrated in FIGS. 49 and 50, a planarization process is performed into the dielectric material 4702 to define a dielectric structure 110. Finally, as illustrated in FIGS. 51 and 52, a color filter 112 and a lens 114 are formed over the dielectric structure 110 and along the back-side 104b of the substrate 104.

Figure 53:
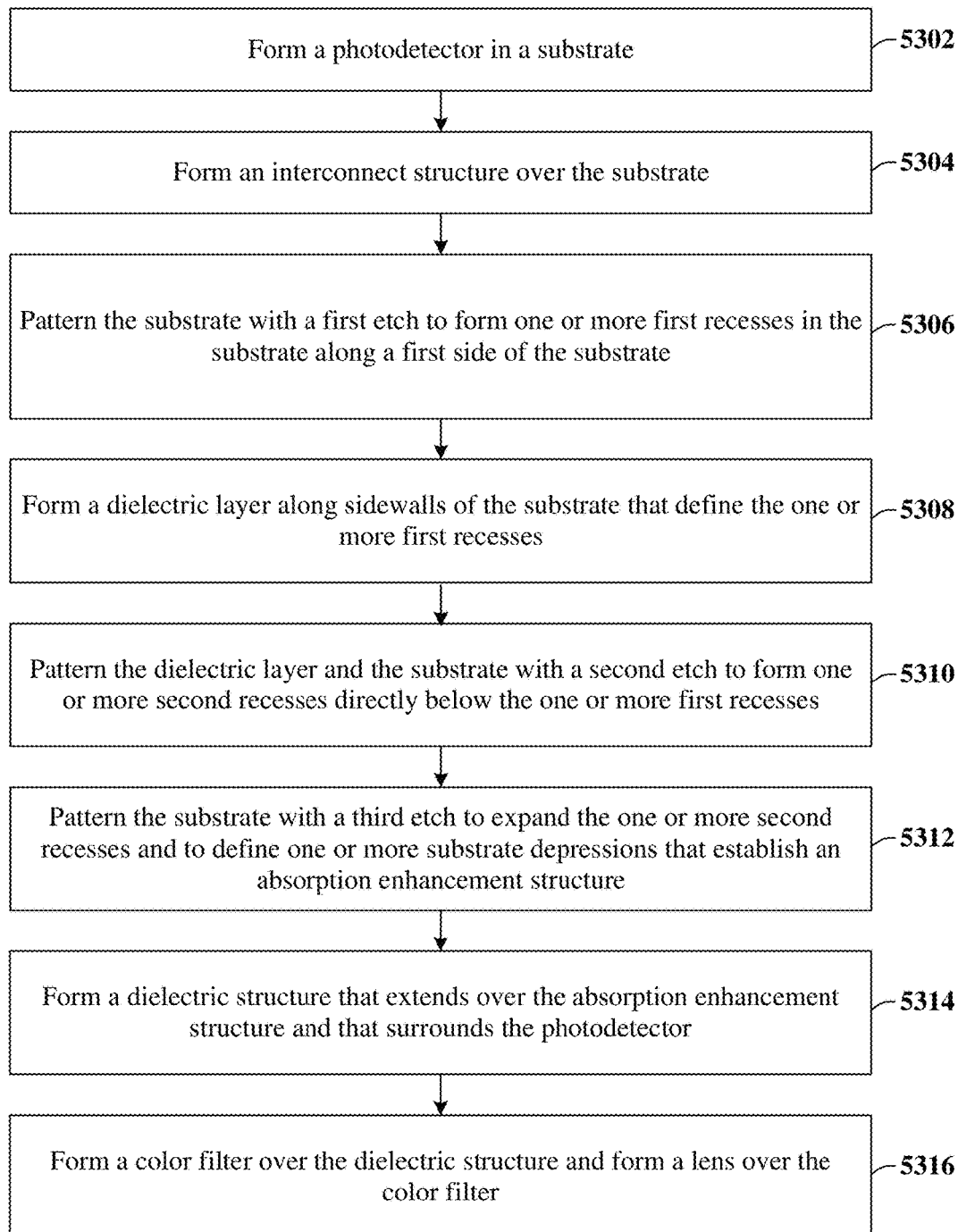
FIG. 53 illustrates a flow diagram of some other embodiments of a method for forming an image sensor comprising an absorption enhancement structure.

FIG. 53 illustrates a flow diagram of some other embodiments of a method 5300 for forming an image sensor comprising an absorption enhancement structure. While method 5300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 5302, a photodetector is formed in a substrate. FIGS. 29 and 30 illustrate a cross-sectional view 2900 and a top view 3000, respectively, of some embodiments corresponding to act 5302.

At 5304, an interconnect structure is formed over the substrate. FIGS. 31 and 32 illustrate a cross-sectional view 3100 and a top view 3200, respectively, of some embodiments corresponding to act 5304.

At 5306, the substrate is patterned with a first etch to form one or more first recesses in the substrate along a first side of the substrate. FIGS. 37 and 38 illustrate a cross-sectional view 3700 and a top view 3800, respectively, of some embodiments corresponding to act 5306.

At 5308, a dielectric layer is formed along sidewalls of the substrate that define the one or more first recesses. FIGS. 39 and 40 illustrate a cross-sectional view 3900 and a top view 4000, respectively, of some embodiments corresponding to act 5308.

At 5310, the dielectric layer and the substrate are patterned with a second etch to form one or more second recesses directly below the one or more first recesses. FIGS. 41 and 42 illustrate a cross-sectional view 4100 and a top view 4200, respectively, of some embodiments corresponding to act 5310.

At 5312, the substrate is patterned with a third etch to expand the one or more second recesses and to define one or more substrate depressions that establish an absorption enhancement structure. FIGS. 43 and 44 illustrate a cross-sectional view 4300 and a top view 4400, respectively, of some embodiments corresponding to act 5312.

At 5314, a dielectric structure that extends over the absorption enhancement structure and that surrounds the photodetector is formed. FIGS. 49 and 50 illustrate a cross-sectional view 4900 and a top view 5000, respectively, of some embodiments corresponding to act 5314.

At 5316, a color filter is formed over the dielectric structure and a lens is formed over the color filter. FIGS. 51 and 52 illustrate a cross-sectional view 5100 and a top view 5200, respectively, of some embodiments corresponding to act 5316.

Thus, the present disclosure relates to an image sensor comprising an absorption enhancement structure for improving a performance of the image sensor.

Accordingly, in some embodiments, the present disclosure relates to an image sensor. The image sensor comprises a substrate and a photodetector in the substrate. The image sensor further comprises an absorption enhancement structure. The absorption enhancement structure comprises a substrate depression along a first side of the substrate. The substrate depression is defined by a first plurality of sidewalls that slope toward a first common point and by a second plurality of sidewalls that slope toward a second common point. The first plurality of sidewalls extend over the second plurality of sidewalls.

In other embodiments, the present disclosure relates to an image sensor comprising a semiconductor substrate. A photodetector is in the semiconductor substrate along a front-side of the semiconductor substrate. One or more substrate depressions are along a back-side of the semiconductor substrate opposite the front-side. The one or more substrate depressions extend over the photodetector and the one or more substrate depressions are defined by a first pair of sidewalls and by a second pair of sidewalls that extend between the first pair of sidewalls. The second pair of sidewalls are separated by a first non-zero angle. The first pair of sidewalls extend over the second pair of sidewalls. The one or more substrate depressions establish an absorption enhancement structure.

In yet other embodiments, the present disclosure relates to a method for forming an image sensor. The method comprises forming a hard mask over a substrate. The hard mask is patterned with a first etch to define a patterned hard mask. One or more etches are performed into the substrate with the patterned hard mask in place to form a substrate depression along a first side of the substrate. The substrate depression establishes an absorption enhancement structure. The substrate depression is defined by a first plurality of sidewalls that slope toward a first common point and by a second plurality of sidewalls that slope toward a second common point. The first plurality of sidewalls extend over the second plurality of sidewalls.

Although the image sensors illustrated are back-side illuminated, it will be appreciated that in some other embodiments (not shown), the image sensor may alternatively be front-side illuminated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a hard mask over a substrate;
    patterning the hard mask to define a patterned hard mask including a first patterned hard mask region and a second patterned hard mask region laterally surrounding the first patterned hard mask region;
    performing one or more etches into the substrate with the patterned hard mask in place to form a substrate depression along a first side of the substrate, wherein the substrate depression establishes an absorption enhancement structure, wherein the substrate depression is defined by a first plurality of sidewalls that slope toward a first common point and by a second plurality of sidewalls that slope toward at a second common point, and wherein the first plurality of sidewalls extend over the second plurality of sidewalls; and
    removing the first patterned hard mask region from over the substrate during the performing of the one or more etches and before removing the second patterned hard mask region from over the substrate.

2. The method of claim 1, wherein the second patterned hard mask region is separated from the first patterned hard mask region by a cavity that surrounds the first patterned hard mask region.

3. The method of claim 1, wherein the one or more etches undercut the first patterned hard mask region, and wherein the first patterned hard mask region is removed once the one or more etches undercut the first patterned hard mask region.

4. The method of claim 1, wherein both the first common point and the second common point are below a top surface of the substrate, and wherein the first common point and the second common point are disposed at different depths below the top surface of the substrate.

5. The method of claim 1, further comprising:
    removing the second patterned hard mask region from over the substrate after the first patterned hard mask region is removed from over the substrate.

6. The method of claim 1, wherein the performing of the one or more etches continues for a period of time after the first patterned hard mask region is removed from over the substrate.

7. The method of claim 3, wherein the first patterned hard mask region is washed away during the performing of the one or more etches in response to the one or more etches undercut the first patterned hard mask region.

8. The method of claim 2, wherein the cavity is delimited by sidewalls of the first patterned hard mask region that face the second patterned hard mask region and sidewalls of the second patterned hard mask region that face the first patterned hard mask region.

9. A method for forming an image sensor, the method comprising:
    forming a photodetector in a substrate;
    depositing a hard mask over the substrate;
    patterning the hard mask to define a patterned hard mask; and
    etching the substrate with the patterned hard mask in place to form a depression in the substrate, wherein the depression is defined by a first pair of sidewalls of the substrate and by a second pair of sidewalls of the substrate, wherein the second pair of sidewalls extend between the first pair of sidewalls, wherein the second pair of sidewalls are separated from each other by a first non-zero angle, and wherein the first pair of sidewalls extend over the second pair of sidewalls, wherein etching the substrate comprises:
        performing a first etching process into the substrate to form a first recess in the substrate;
        performing a second etching process into the substrate to form a second recess in the substrate below the first recess; and
        performing a third etching process into the substrate to enlarge the second recess.

10. The method of claim 9, wherein the first etching process undercuts the patterned hard mask.

11. The method of claim 9,
    wherein the first recess is defined by the first pair of sidewalls of the substrate, and wherein the second recess is defined by the second pair of sidewalls after the third etching process.

12. The method of claim 11, wherein etching the substrate further comprises:
    depositing a dielectric layer on the first pair of sidewalls before performing the second etching process, wherein the second etching process extends through the dielectric layer and into the substrate to form the second recess.

13. The method of claim 11, wherein the second recess is further defined by a third pair of sidewalls of the substrate after the third etching process, wherein the first pair of sidewalls and the third pair of sidewalls are separated by a pair of second non-zero angles, and wherein the second pair of sidewalls and the third pair of sidewalls are separated by a pair of third non-zero angles.

14. The method of claim 9, wherein the first etching process comprises a first wet etching process, the second etching process comprises a dry etching process, and the third etching process comprises a second wet etching process.

15. The method of claim 12, wherein the dielectric layer is deposited directly under the patterned hard mask.

16. The method of claim 12, further comprising:
removing the dielectric layer and the patterned hard mask after the third etching process is performed.

17. A method for forming an image sensor, the method comprising:
forming a photodetector in a substrate;
forming a hard mask over the substrate;
patterning the hard mask to define a patterned hard mask having one or more openings over the substrate, the patterned hard mask including a first patterned hard mask region, a second patterned hard mask region laterally surrounding the first patterned hard mask region, and a plurality of patterned hard mask segments that extend between the first patterned hard mask region and the second patterned hard mask region at corners of the first patterned hard mask region; and
etching the substrate with the patterned hard mask in place to form a depression in the substrate, wherein the depression is delimited by a first pair of sidewalls and a second pair of sidewalls of the substrate, wherein the first pair of sidewalls slope toward a first common point and the second pair of sidewalls slope toward a second common point, wherein the first common point is disposed at a first depth below a top of the substrate, and wherein the second common point is disposed at a second depth below the top of the substrate, and wherein the second depth is different than the first depth.

18. The method of claim 17, wherein the first pair of sidewalls and the second pair of sidewalls are directly over the photodetector, and wherein tops of the first pair of sidewalls are disposed above tops the second pair of sidewalls.

19. The method of claim 17, wherein the plurality of patterned hard mask segments join the first patterned hard mask region and the second patterned hard mask region such that the patterned hard mask extends continuously from the first patterned hard mask region to the second patterned hard mask region via the plurality of patterned hard mask segments.

20. The method of claim 17, wherein the first patterned hard mask region is separated from the second patterned hard mask region at sidewalls of the first patterned hard mask region.

* * * * *